(12) United States Patent
Sobue

(10) Patent No.: US 12,159,866 B2
(45) Date of Patent: Dec. 3, 2024

(54) SEMICONDUCTOR INTEGRATED CIRCUIT DEVICE

(71) Applicant: SOCIONEXT INC., Kanagawa (JP)

(72) Inventor: Isaya Sobue, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 717 days.

(21) Appl. No.: 17/394,065

(22) Filed: Aug. 4, 2021

(65) Prior Publication Data

US 2021/0366902 A1   Nov. 25, 2021

Related U.S. Application Data

(63) Continuation of application No. PCT/JP2020/010274, filed on Mar. 10, 2020.

(30) Foreign Application Priority Data

Mar. 15, 2019   (JP) ................. 2019-048205

(51) Int. Cl.
| | |
|---|---|
| *H01L 27/06* | (2006.01) |
| *B82Y 10/00* | (2011.01) |
| *H01L 21/822* | (2006.01) |
| *H01L 21/8238* | (2006.01) |
| *H01L 27/092* | (2006.01) |

(Continued)

(52) U.S. Cl.
CPC ...... *H01L 27/0629* (2013.01); *H01L 27/0922* (2013.01); *H01L 29/0665* (2013.01); *H01L 29/42392* (2013.01); *H01L 29/78696* (2013.01)

(58) Field of Classification Search
CPC ............. H01L 27/0629; H01L 27/0922; H01L 29/0665; H01L 29/42392; H01L 29/78696; H01L 29/0673; H01L 29/0847; H01L 29/775; H01L 21/8221; H01L 21/823871;

(Continued)

(56) References Cited

U.S. PATENT DOCUMENTS

| | | |
|---|---|---|
| 2014/0246715 A1 | 9/2014 | Kamal et al. |
| 2015/0155278 A1 | 6/2015 | Seo et al. |

(Continued)

FOREIGN PATENT DOCUMENTS

| | | | |
|---|---|---|---|
| JP | 60225444 A | * 11/1985 | ......... H01L 21/8238 |
| JP | S60-225444 A | 11/1985 | |

(Continued)

OTHER PUBLICATIONS

JPS60225444A_Machine_Translation (Year: 1984).*

(Continued)

*Primary Examiner* — Yara B Green
*Assistant Examiner* — Akhee Sarker-Nag
(74) *Attorney, Agent, or Firm* — Rimon P.C.

(57) ABSTRACT

A layout structure of a capacitive element using a complementary FET (CFET) and having a high breakdown voltage is provided. In the capacitive element, first and second transistors overlap as viewed in plan, and the gates thereof are mutually connected. Third and fourth transistors overlap as viewed in plan, and the gates thereof are mutually connected. Nodes of the first and third transistors are mutually connected through a local interconnect, and nodes of the second and fourth transistors are mutually connected through a local interconnect.

18 Claims, 24 Drawing Sheets

(51) Int. Cl.
  *H01L 29/06* (2006.01)
  *H01L 29/08* (2006.01)
  *H01L 29/423* (2006.01)
  *H01L 29/775* (2006.01)
  *H01L 29/786* (2006.01)

(58) Field of Classification Search
  CPC ........ H01L 27/0688; H01L 21/823807; B82Y 10/00
  See application file for complete search history.

(56) References Cited

U.S. PATENT DOCUMENTS

| 2017/0040321 | A1 | 2/2017 | Mitard |
| 2019/0006458 | A1 | 1/2019 | Chan et al. |
| 2021/0104552 | A1 | 4/2021 | Shimbo |

FOREIGN PATENT DOCUMENTS

| JP | 63137450 A | * | 6/1988 | ......... H01L 27/0688 |
| JP | S63-137450 A | | 6/1988 | |
| JP | H08-306870 A | | 11/1996 | |
| JP | 2011-14753 A | | 1/2011 | |
| WO | 2018/025580 A1 | | 2/2018 | |

OTHER PUBLICATIONS

JPS63137450A_Machine_Translation (Year: 1986).*
JPS60225444A_Combined_with_English_Translation (Year: 1984).*
JPS63137450A_Combined_with_English_Translation (Year: 1986).*
Ryckaert J. et al., "The Complementary FET (CFET) for CMOS scaling beyond N3," 2018 Symposium on VLSI Technology Digest of Technical Papers; pp. 141-142.
A. Mocuta et al., "Enabling CMOS Scaling Towards 3nm and Beyond", 2018 Symposium on VLSI Technology Digest of Technical Papers; pp. 147-148.
International Search Report issued in International Patent Application No. PCT/JP2020/010274, dated Jun. 16, 2020; with English translation.
Written Opinion of the International Searching Authoriryt issued in International Patent Application No. PCT/JP2020/010274, dated Jun. 16, 2020; with English translation.
Notice of Reasons for Refusal dated Apr. 16, 2024 issued in the corresponding Japanese Patent Application No. 2019-048205, with partial English translation.

* cited by examiner

LOWER PART(Pch)
UPPER PART(Nch)
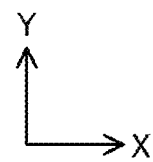
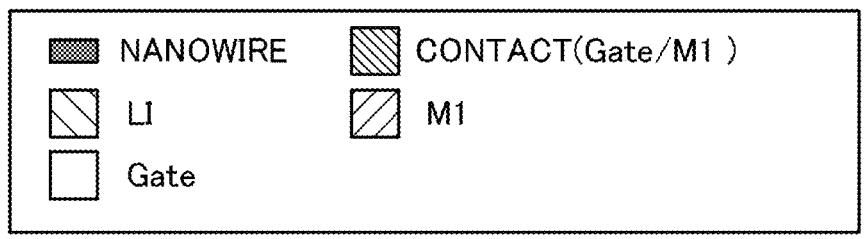

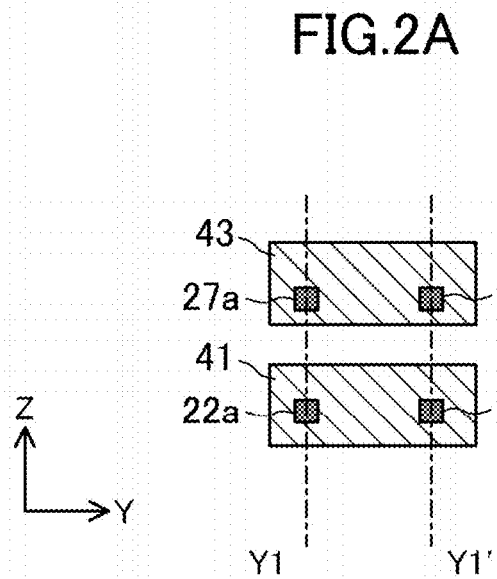
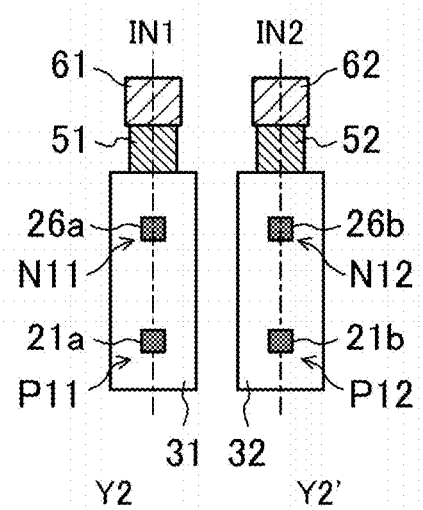
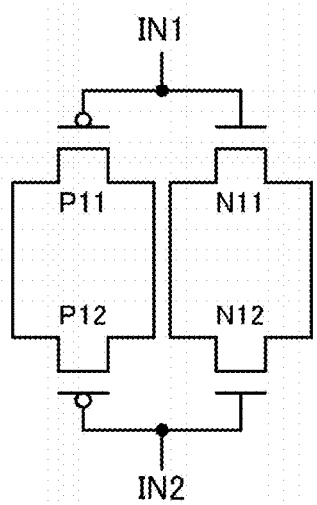

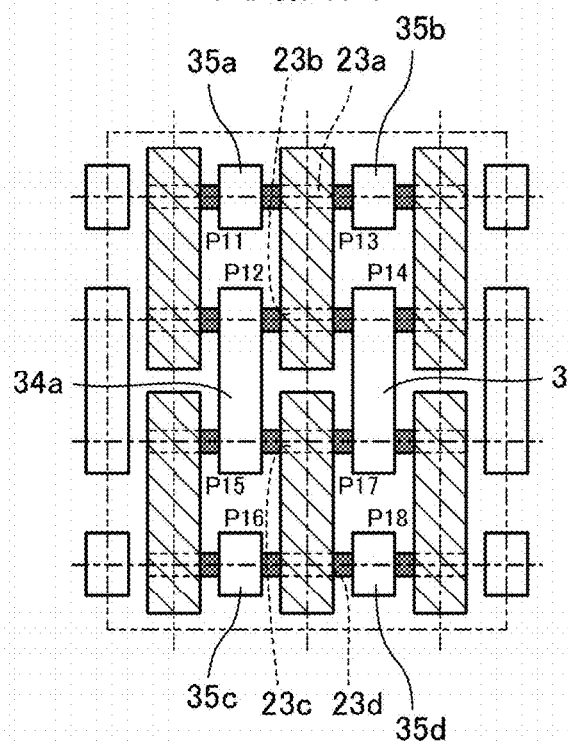
FIG.4A
LOWER PART(Pch)
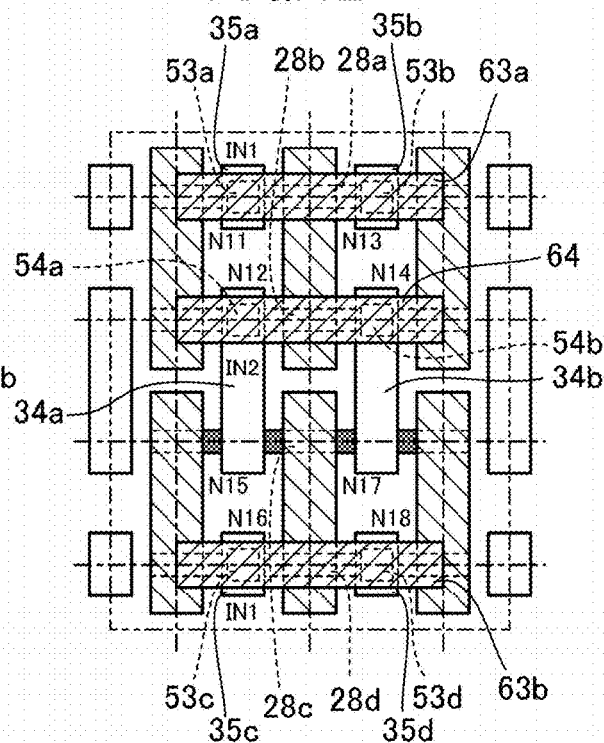
FIG.4B
UPPER PART(Nch)
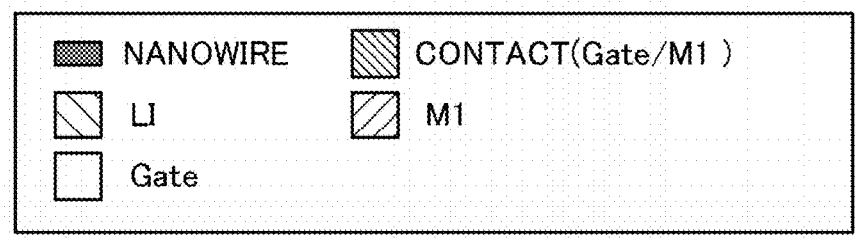

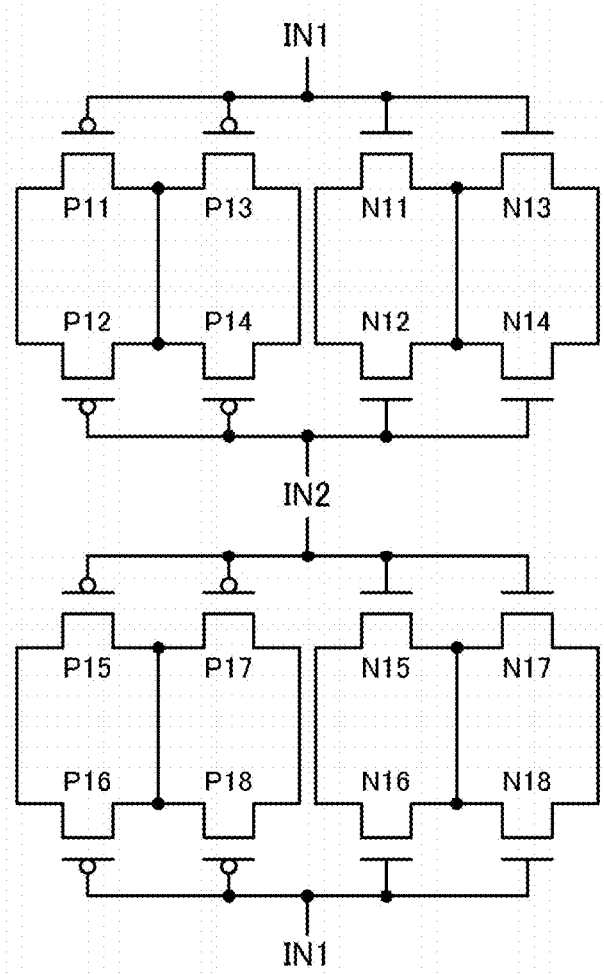

FIG.6A
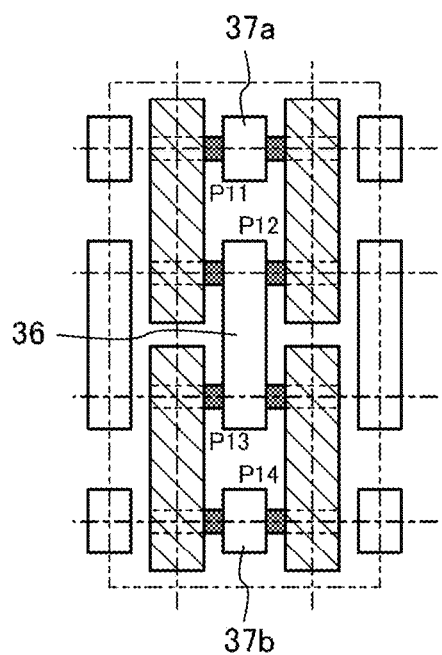
LOWER PART(Pch)
FIG.6B
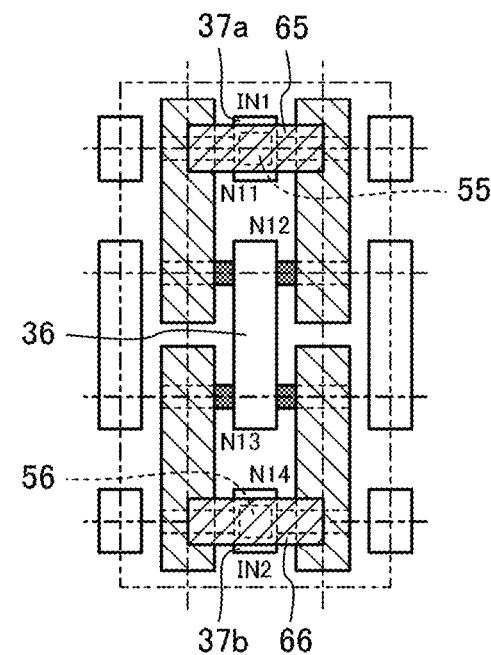
UPPER PART(Nch)
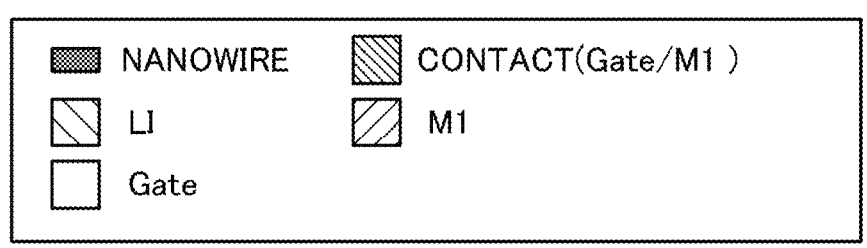
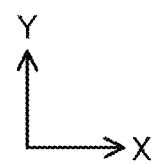

FIG.8A
FIG.8B
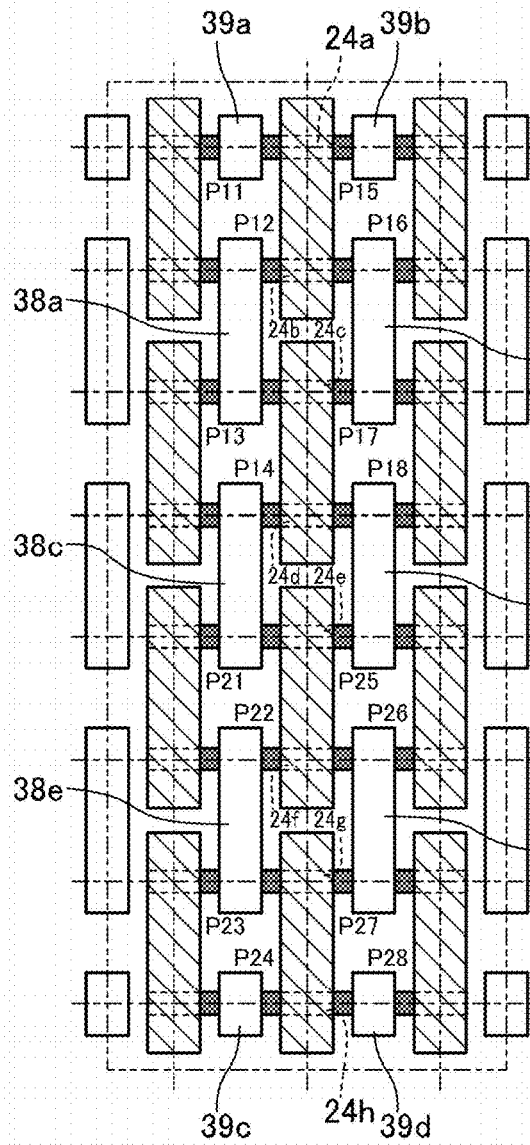
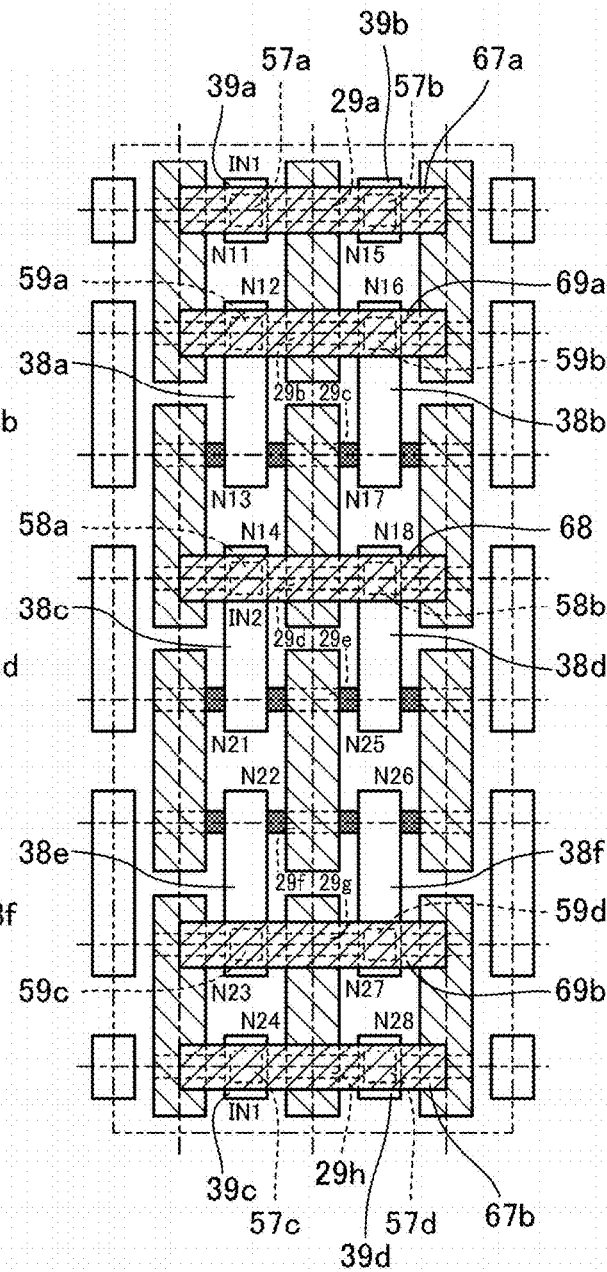
LOWER PART(Pch)
UPPER PART(Nch)
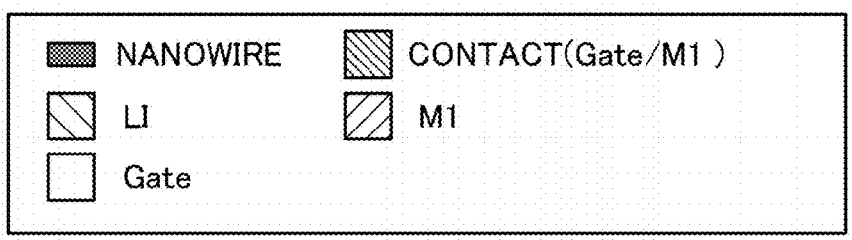

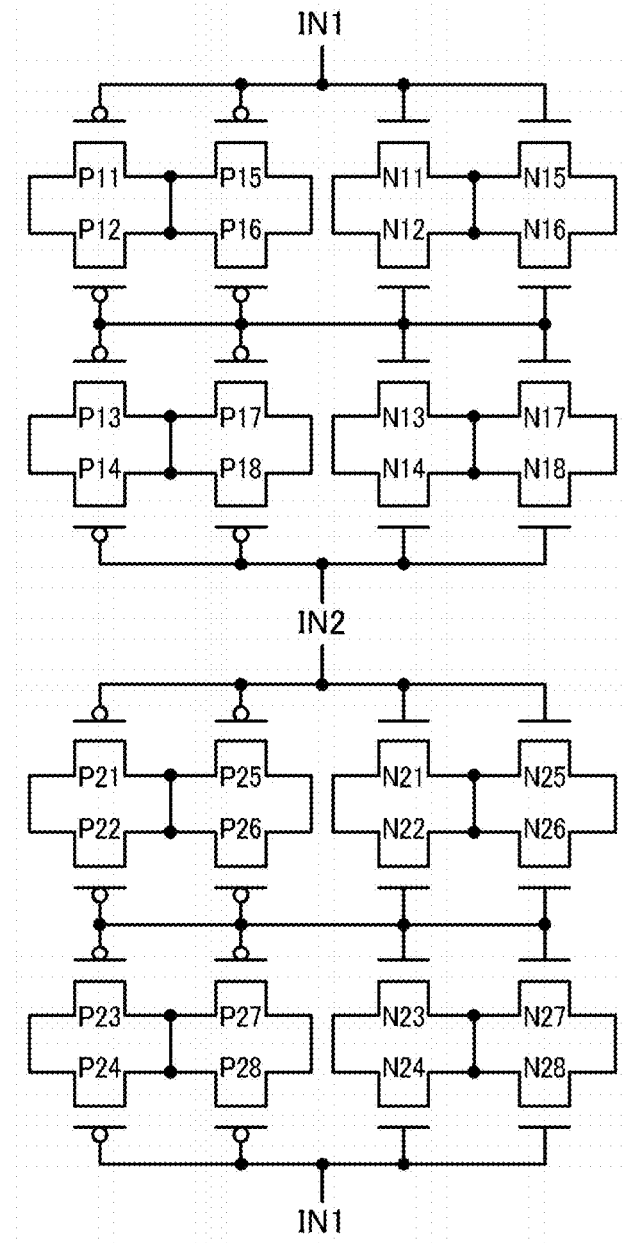

FIG.10A
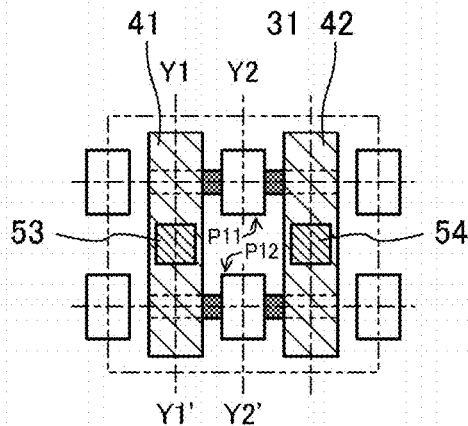
LOWER PART(Pch)
FIG.10B
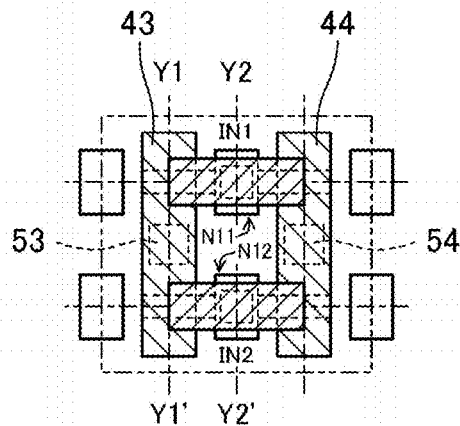
UPPER PART(Nch)
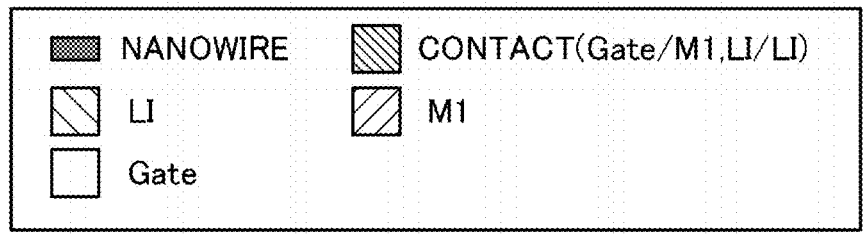
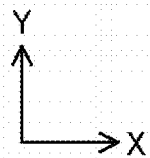
FIG.11
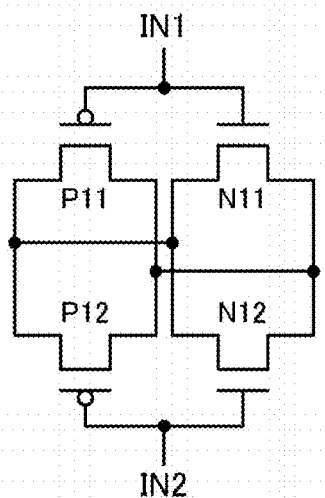

FIG.12A
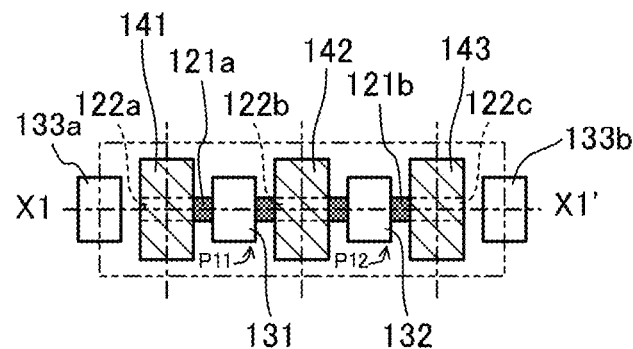
LOWER PART(Pch)
FIG.12B
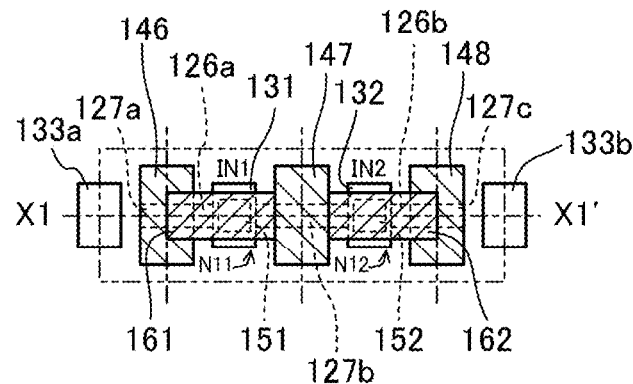
UPPER PART(Nch)
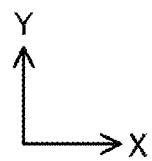

FIG.15A
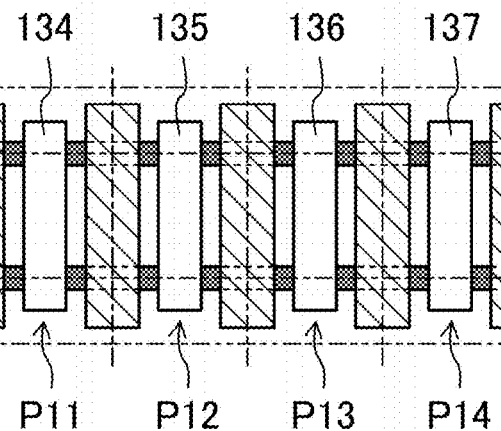
LOWER PART(Pch)
FIG.15B
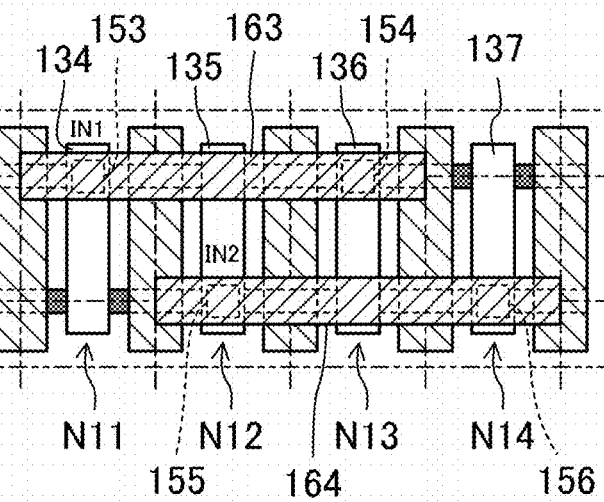
UPPER PART(Nch)
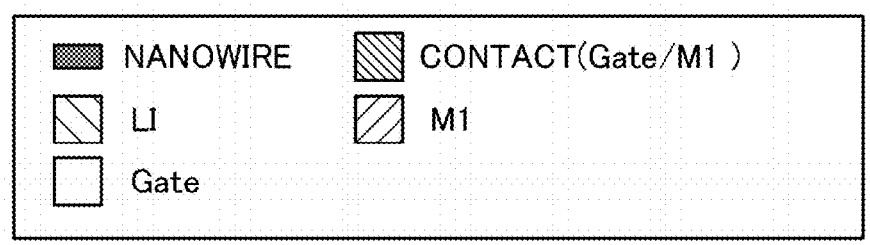
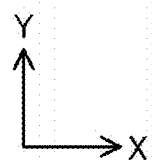

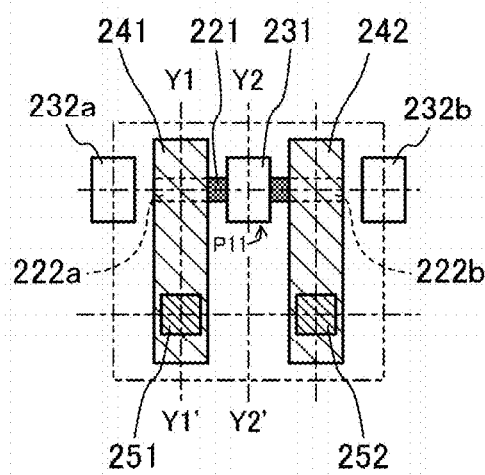
FIG.17A
LOWER PART(Pch)
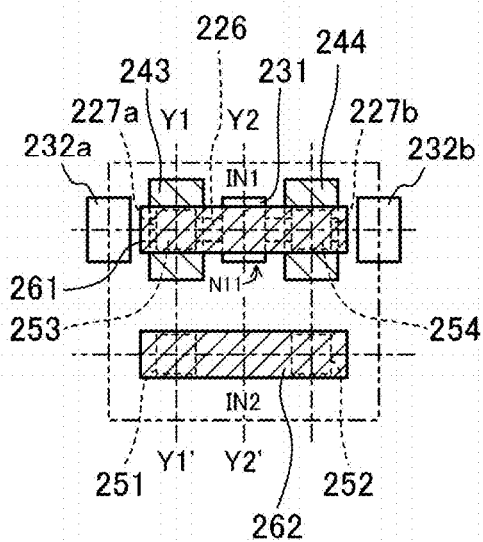
FIG.17B
UPPER PART(Nch)
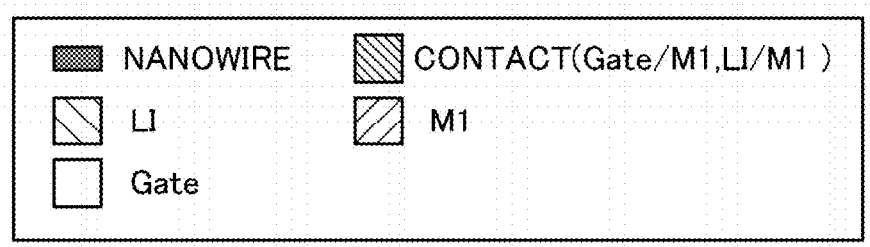

FIG.20A
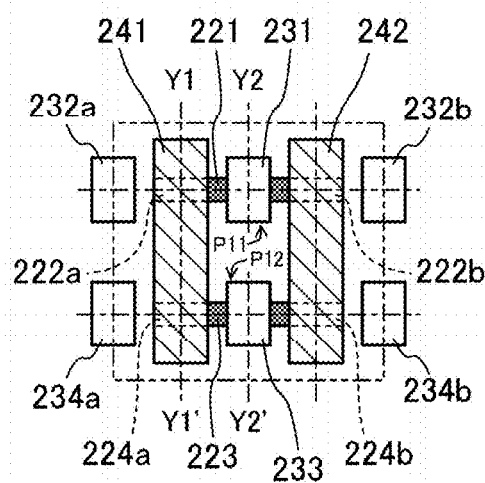
LOWER PART(Pch)
FIG.20B
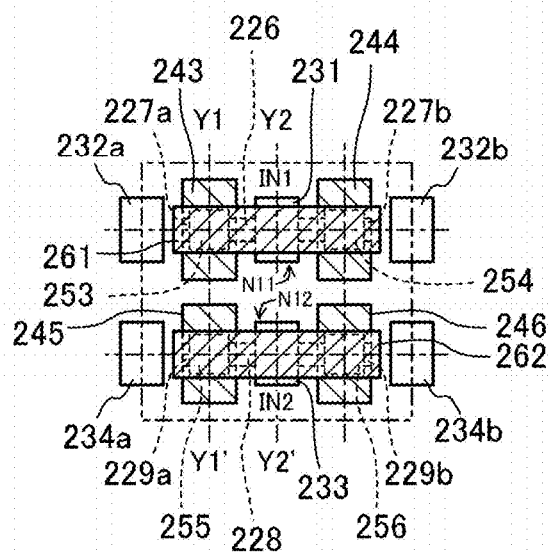
UPPER PART(Nch)
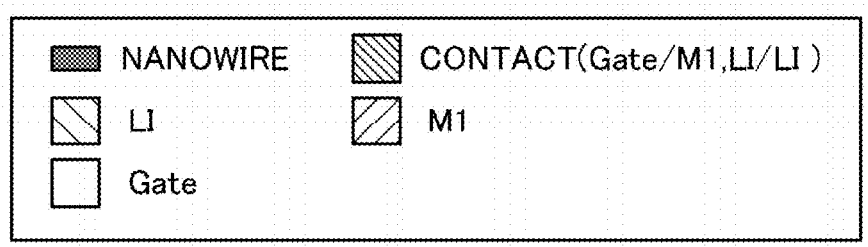
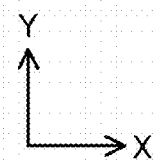

FIG.23A
FIG.23B
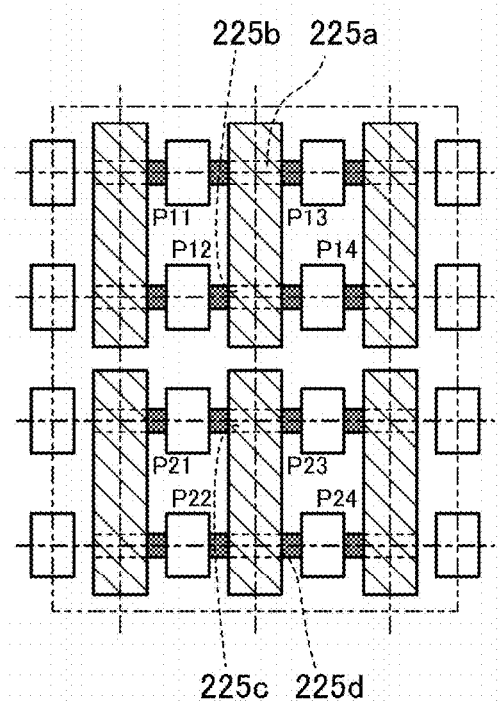
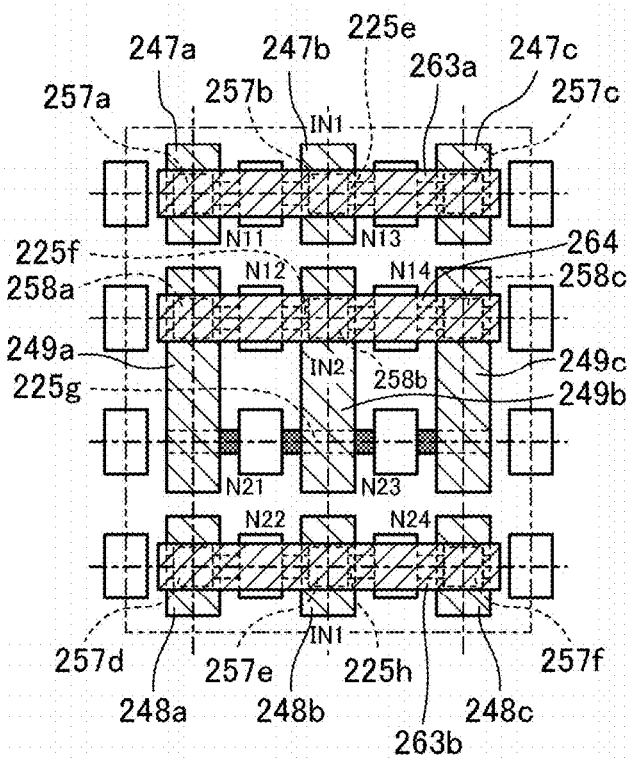
LOWER PART(Pch)
UPPER PART(Nch)
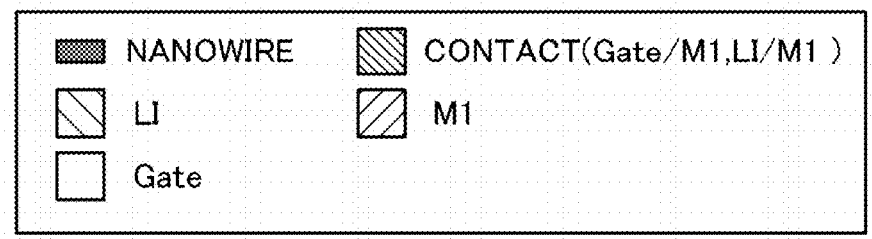
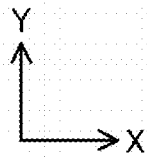

SEMICONDUCTOR INTEGRATED CIRCUIT DEVICE

CROSS-REFERENCE TO RELATED APPLICATIONS

This is a continuation of International Application No. PCT/JP2020/010274 filed on Mar. 10, 2020, which claims priority to Japanese Patent Application No. 2019-048205 filed on Mar. 15, 2019. The entire disclosures of these applications are incorporated by reference herein.

BACKGROUND

The present disclosure relates to a semiconductor integrated circuit device provided with three-dimensional transistors, and more particularly to a layout structure of a capacitive element using three-dimensional transistors.

In a semiconductor integrated circuit device, as the process becomes finer, the breakdown voltage of transistors tends to become lower. On the other hand, some of interfaces responsible for input/output of signals from/to the outside of the device require a high voltage exceeding the breakdown voltage of transistors according to the specifications thereof and the like.

A capacitive element is one of basic elements constituting a semiconductor integrated circuit. In a semiconductor integrated circuit device, a capacitive element is made up using transistors in some cases.

As for transistors as basic constituents of an LSI, improvement in integration degree, reduction in operating voltage, and improvement in operating speed have been achieved thanks to scaling down of the gate length. Recently, however, an increase in off current due to excessive scaling and the resulting significant increase in power consumption have raised a problem. To solve this problem, three-dimensional transistors having a three-dimensional structure, changed from the conventional planar structure, have been vigorously studied.

Japanese Unexamined Patent Publication No. H08-306870 discloses a high breakdown-voltage capacitive element made up by connecting transistors in series.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

A three-dimensional device in which three-dimensional p-type FET and n-type FET are stacked vertically to a substrate is herein called a complementary FET (CFET) following the cited paper by Ryckaert J. et al. Also, the direction vertical to the substrate is herein called the depth direction.

There is however no prior art document that discloses a layout structure of a high breakdown-voltage capacitive element using a CFET.

An objective of the present disclosure is providing a layout structure of a capacitive element using a CFET and having a high breakdown voltage.

SUMMARY

In the first mode of the present disclosure, a semiconductor integrated circuit device provided with a capacitive element is provided. The capacitive element includes at least one capacitive structure provided between a first node and a second node, the capacitive structure including: a first transistor that is a three-dimensional transistor of a first conductivity type; a second transistor that is a three-dimensional transistor of a second conductivity type, formed above the first transistor in a depth direction, overlapping the first transistor as viewed in plan, a gate thereof being connected with a gate of the first transistor; a third transistor that is a three-dimensional transistor of the first conductivity type formed at a same level as the first transistor; a fourth transistor that is a three-dimensional transistor of the second conductivity type, formed at a same level as the second transistor, overlapping the third transistor as viewed in plan, a gate thereof being connected with a gate of the third transistor; a first local interconnect extending in a second direction perpendicular to a first direction in which channel portions of the first to fourth transistors extend, and connecting one node of the first transistor and one node of the third transistor; and a second local interconnect extending in the second direction and connecting one node of the second transistor and one node of the fourth transistor.

According to the above mode, the capacitive element is formed using the first and second transistors that overlap each other as viewed in plan and of which the gates are mutually connected and the third and fourth transistors that overlap each other as viewed in plan and of which the gates are mutually connected. Nodes of the first and third transistors are mutually connected through a local interconnect, and nodes of the second and fourth transistors are mutually connected through a local interconnect. Therefore, a capacitive element with a high breakdown voltage and a small area is implemented.

In the second mode of the present disclosure, a semiconductor integrated circuit device provided with a capacitive element is provided. The capacitive element includes at least one capacitive structure provided between a first node and a second node, the capacitive structure including: a first transistor that is a three-dimensional transistor of a first conductivity type; a second transistor that is a three-dimensional transistor of a second conductivity type, formed above the first transistor in a depth direction, overlapping the first transistor as viewed in plan, a gate thereof being connected with a gate of the first transistor; a third transistor that is a three-dimensional transistor of the first conductivity type formed at a same level as the first transistor; and a fourth transistor that is a three-dimensional transistor of the second conductivity type, formed at a same level as the second transistor, overlapping the third transistor as viewed in plan, a gate thereof being connected with a gate of the third transistor, wherein the first and third transistors are arranged in a first direction in which channel portions of the first to fourth transistors extend, and share one node, and the second and fourth transistors are arranged in the first direction and share one node.

According to the above mode, the capacitive element is formed using the first and second transistors that overlap each other as viewed in plan and of which the gates are mutually connected and the third and fourth transistors that overlap each other as viewed in plan and of which the gates are mutually connected. The first and third transistors lie side by side in the first direction and share one node, and the second and fourth transistors lie side by side in the first direction and share one node. Therefore, a capacitive element with a high breakdown voltage and a small area is implemented.

In the third mode of the present disclosure, a semiconductor integrated circuit device including a capacitive element is provided between a first node and a second node, the capacitive element including: a first transistor that is a three-dimensional transistor of a first conductivity type; a second transistor that is a three-dimensional transistor of a second conductivity type, formed above the first transistor in a depth direction, overlapping the first transistor as viewed in plan, a gate thereof being connected with a gate of the first transistor; a first local interconnect connected with one node of the first transistor and also connected with one of the first and second nodes; and a second local interconnect connected with one node of the second transistor and also connected with the other of the first and second nodes.

According to the above mode, the capacitive element is formed using the first and second transistors that overlap each other as viewed in plan and of which the gates are mutually connected. A node of the first transistor is connected with one of the first and second nodes through the first local interconnect, and a node of the second transistor is connected with the other of the first and second nodes through the second local interconnect. Therefore, a capacitive element with a high breakdown voltage and a small area is implemented.

In the fourth mode of the present disclosure, a semiconductor integrated circuit device provided with a capacitive element is provided. The capacitive element includes at least one capacitive structure provided between a first node and a second node, the capacitive structure including: a first transistor that is a three-dimensional transistor of a first conductivity type; a second transistor that is a three-dimensional transistor of a second conductivity type, formed above the first transistor in a depth direction, overlapping the first transistor as viewed in plan, a gate thereof being connected with a gate of the first transistor; a third transistor that is a three-dimensional transistor of the first conductivity type formed at a same level as the first transistor; a fourth transistor that is a three-dimensional transistor of the second conductivity type, formed at a same level as the second transistor, overlapping the third transistor as viewed in plan, a gate thereof being connected with a gate of the third transistor; and a first local interconnect extending in a second direction perpendicular to a first direction in which channel portions of the first to fourth transistors extend, and connecting one node of the first transistor and one node of the third transistor, wherein at least one node of the second transistor is connected with one of the first and second nodes, and at least one node of the fourth transistor is connected with the other of the first and second nodes.

According to the above mode, the capacitive element is formed using the first and second transistors that overlap each other as viewed in plan and of which the gates are mutually connected and the third and fourth transistors that overlap each other as viewed in plan and of which the gates are mutually connected. Nodes of the first and third transistors are mutually connected through the first local interconnect, a node of the second transistor is connected with one of the first and second nodes, and a node of the fourth transistor is connected with the other of the first and second nodes. Therefore, a capacitive element with a high breakdown voltage and a small area is implemented.

According to the present disclosure, a capacitive element with a high breakdown voltage can be implemented using a CFET.

BRIEF DESCRIPTION OF THE DRAWINGS

FIGS. 2A and 2B are cross-sectional views of the layout structure of FIGS. 1A and 1B taken in the vertical direction as viewed in plan.

FIG. 3 is a circuit diagram of the capacitive element of FIGS. 1A and 1B.

FIGS. 4A and 4B are plan views showing an example of a layout structure in which structures each same as the structure of FIGS. 1A and 1B are arranged in an array.

FIG. 5 is a circuit diagram of the capacitive element of FIGS. 4A and 4B.

FIGS. 6A and 6B are plan views showing an example of a layout structure in which structures each same as the structure of FIGS. 1A and 1B are connected in series.

FIGS. 8A and 8B are plan views showing an example of a layout structure in which structures each same as the structure of FIGS. 6A and 6B are arranged in an array.

FIG. 9 is a circuit diagram of the capacitive element of FIGS. 8A and 8B.

FIGS. 10A and 10B are plan views showing an example of the layout structure of a capacitive element according to an alteration of the first embodiment.

FIG. 11 is a circuit diagram of the capacitive element of FIGS. 10A and 10B.

FIGS. 12A and 12B are plan views showing an example of the layout structure of a capacitive element according to the second embodiment.

FIGS. 15A and 15B are plan views showing an example of a layout structure in which structures each same as the structure of FIGS. 12A and 12B are arranged in an array.

FIGS. 17A and 17B are plan views showing an example of the layout structure of a capacitive element according to the third embodiment.

FIGS. 20A and 20B are plan views showing an example of a layout structure in which structures each same as the structure of FIGS. 17A and 17B are connected in series.

FIGS. 23A and 23B are plan views showing an example of a layout structure in which structures each same as the structure of FIGS. 20A and 20B are arranged in an array.

DETAILED DESCRIPTION

Embodiments of the present disclosure will be described hereinafter with reference to the accompanying drawings. In the following embodiments, a semiconductor integrated circuit device includes a plurality of standard cells (herein simply called cells as appropriate), and at least some of the plurality of standard cells include a CFET, that is, a three-dimensional device in which three-dimensional p-type FET and n-type FET are stacked vertically to a substrate.

Figure 25:
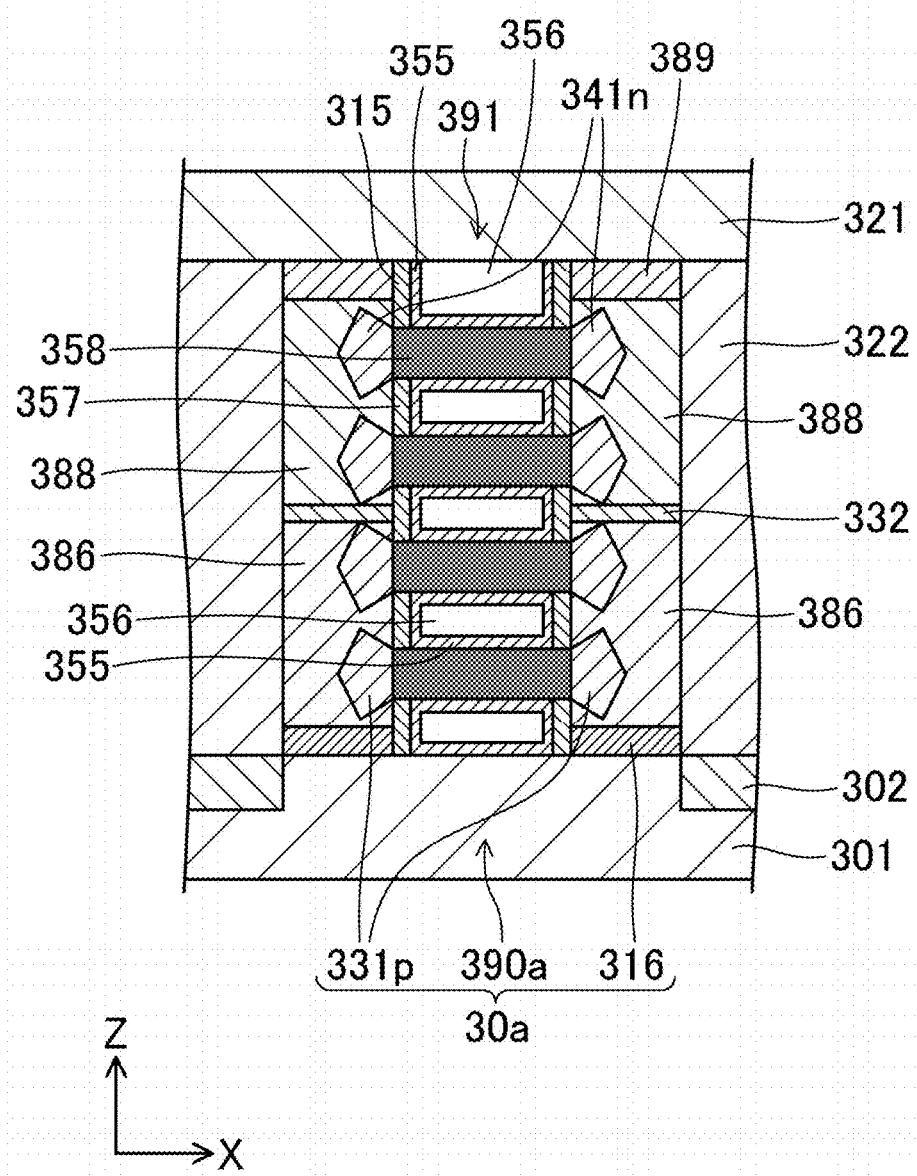
FIG. 25 is a cross-sectional view showing a structure of a semiconductor device provided with a CFET.
Figure 26:
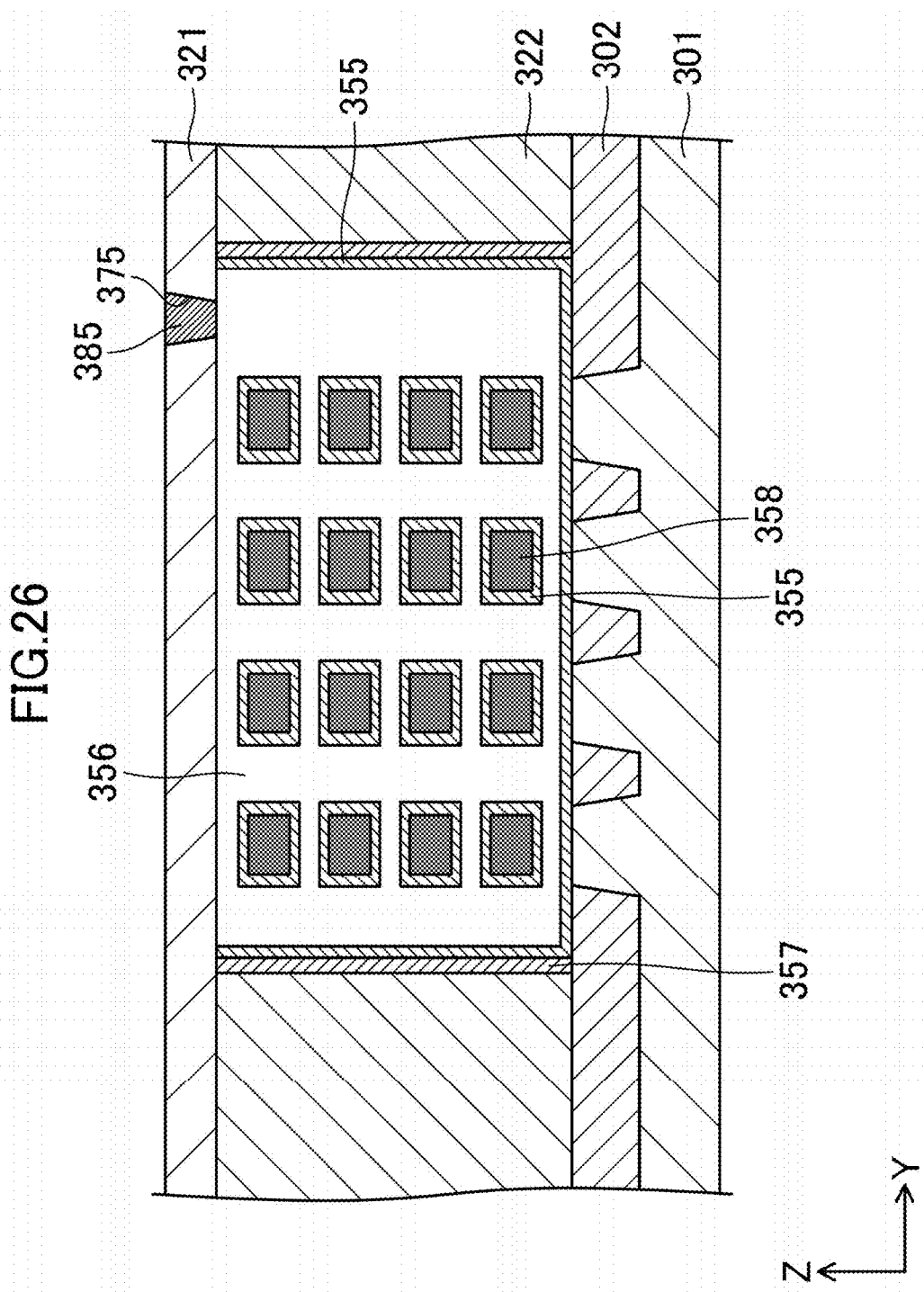
FIG. 26 is a cross-sectional view showing the structure of the semiconductor device provided with a CFET.
Figure 27:
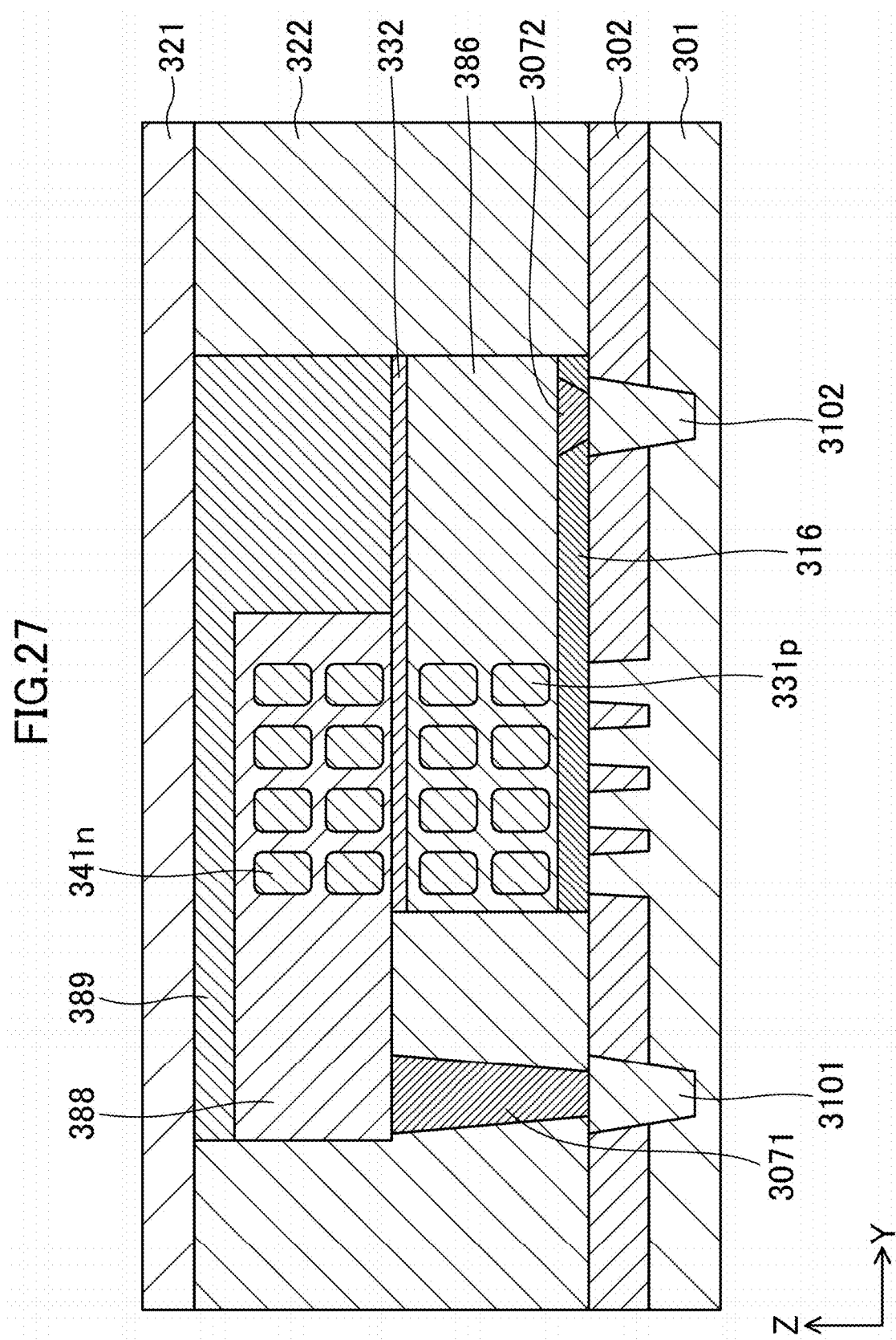
FIG. 27 is a cross-sectional view showing the structure of the semiconductor device provided with a CFET.
Figure 28:
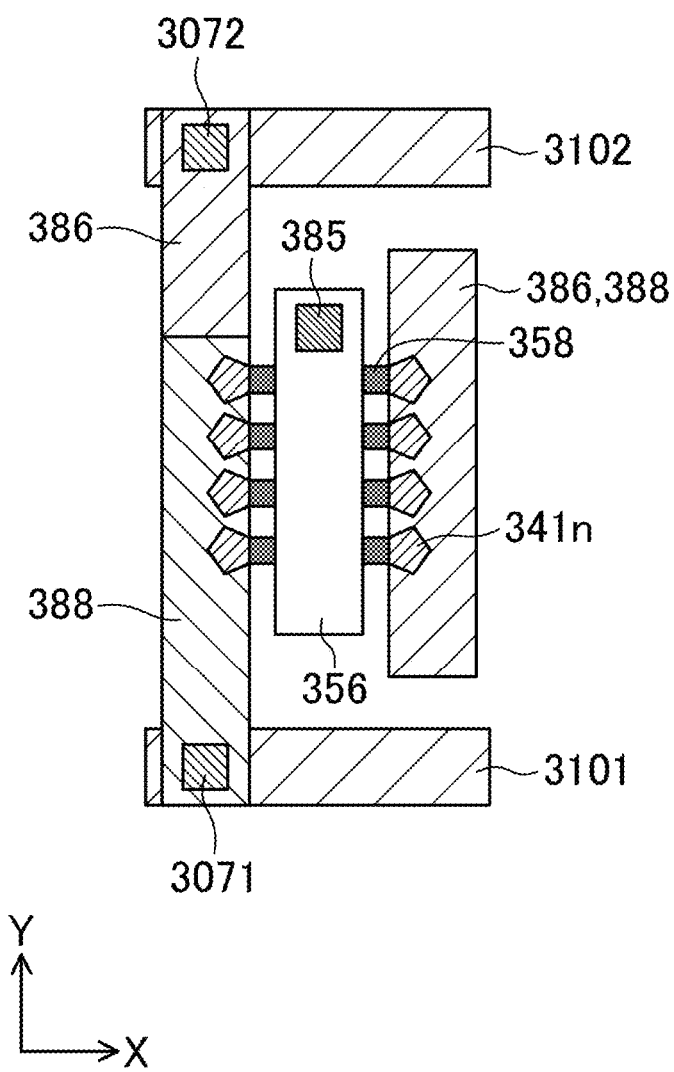
FIG. 28 is a plan view showing the structure of the semiconductor device provided with a CFET.

First, the basic structure of the CFET will be described. FIGS. 25 to 28 are views showing a structure of a semiconductor device provided with a CFET, where FIG. 25 is a cross-sectional view taken in an X direction, FIG. 26 is a cross-sectional view of a gate portion taken in a Y direction, FIG. 27 is a cross-sectional view of a source/drain portion taken in the Y direction, and FIG. 28 is a plan view. Note that the X direction refers to the direction in which nanowires extend, the Y direction refers to the direction in which a gate extends, and a Z direction refers to the direction vertical to the substrate plane. Note also that FIGS. 25 to 28 are schematic views in which the dimensions and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 26, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 27, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

A semiconductor layer portion formed on each end of a nanowire to constitute a terminal that is to be the source or drain of a transistor is herein called a "pad." In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads on both ends of the nanowires may be illustrated in simplified linear shapes in some cases. Also, as used herein, an expression indicating that sizes, etc. are identical, such as the "same size," is to be understood as including a range of manufacturing variations.

In the following description, the source and drain of a transistor are called the "nodes" of the transistor as appropriate. That is, one node of a transistor refers to the source or drain of the transistor, and both nodes of a transistor refer to the source and drain of the transistor.

First Embodiment

Figure 1A:
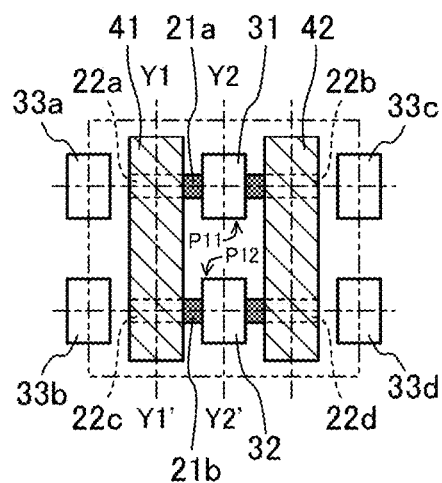
FIGS. 1A and 1B are plan views showing an example of the layout structure of a capacitive element according to the first embodiment.
Figure 1B:
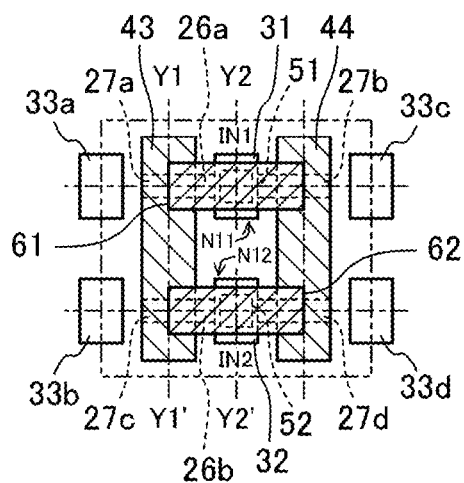

FIGS. 1A, 1B, 2A, and 2B are views showing an example of the layout structure of a capacitive element according to the first embodiment, where FIGS. 1A and 1B are plan views and FIGS. 2A and 2B are cross-sectional views taken in the vertical direction as viewed in plan. Specifically, FIG. 1A shows a lower part, i.e., a portion including a three-dimensional transistor formed closer to a substrate (a p-type nanowire FET in the illustrated example), and FIG. 1B shows an upper part, i.e., a portion including a three-dimensional transistor formed away from the substrate (an n-type nanowire FET in the illustrated example). FIG. 2A shows a cross section taken along line Y1-Y1', and FIG. 2B shows a cross section taken along line Y2-Y2'.

FIG. 3 is a circuit diagram showing a configuration of the capacitive element shown in FIGS. 1A, 1B, 2A, and 2B. A semiconductor integrated circuit device according to this embodiment includes the capacitive element shown in FIG. 3. The capacitive element of FIG. 3 includes p-conductivity type transistors P11 and P12 and n-conductivity type transistors N11 and N12 placed between a node IN1 and a node IN2. The gates of the transistors P11 and N11 are connected with the node IN1, and the gates of the transistors P12 and N12 are connected with the node IN2. Both nodes of the transistor P11 are connected with both nodes of the transistor P12, and both nodes of the transistor N11 are connected with both nodes of the transistor N12. That is, the capacitive element of FIG. 3 has one capacitive structure including the transistors P11, P12, N11, and N12 provided between the nodes IN1 and IN2. Signals, for example, are given to the nodes IN1 and IN2, or the nodes IN1 and IN2 are connected with power supply lines. In the latter case, the capacitive element functions as an inter-power supply capacitance.

In the configuration of FIG. 3, the voltage applied to the transistors P11, P12, N11, and N12 becomes ½ of the voltage between the nodes IN1 and IN2. It is therefore possible to apply, to the capacitive element, a voltage higher than the breakdown voltage of the transistors P11, P12, N11, and N12.

In the following description, in the plan views such as FIGS. 1A and 1B, the horizontal direction in the figure is called the X direction (corresponding to the first direction), and the vertical direction in the figure is called the Y direction (corresponding to the second direction). The direction vertical to the substrate plane is called the Z direction (corresponding to the depth direction). Also, the dashed lines running horizontally and vertically in the plan views such as FIGS. 1A and 1B and the dashed lines running vertically in the cross-sectional views such as FIGS. 2A and 2B represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

As shown in FIGS. 1A, 1B, 2A, and 2B, nanowires 21a and 21b extending in the X direction are formed in the lower part of the capacitive element, and nanowires 26a and 26b extending in the X direction are formed in the upper part of the capacitive element. The nanowires 21a and 26a overlap each other as viewed in plan, and the nanowires 21b and 26b overlap each other as viewed in plan. Gate interconnects 31 and 32 extend in the Z direction in parallel with each other over the lower and upper parts. The gate interconnect 31 is to be the gates of the transistors P11 and N11, and the gate interconnect 32 is to be the gates of the transistors P12 and N12. Dummy gate interconnects 33a, 33b, 33c, and 33d are formed on both ends of the capacitive element in the X direction. Like the gate interconnects 31 and 32, the dummy gate interconnects 33a, 33b, 33c, and 33d extend in the Z direction.

Pads 22a and 22b doped with a p-type semiconductor are formed at both ends of the nanowire 21a, and pads 22c and 22d doped with a p-type semiconductor are formed at both ends of the nanowire 21b. The nanowires 21a and 21b respectively constitute the channel portions of the transistors P11 and P12. The pads 22a and 22b constitute the nodes of the transistor P11, and the pads 22c and 22d constitute the nodes of the transistor P12.

Pads 27a and 27b doped with an n-type semiconductor are formed at both ends of the nanowire 26a, and pads 27c and 27d doped with an n-type semiconductor are formed at both ends of the nanowire 26b. The nanowires 26a and 26b respectively constitute the channel portions of the transistors N11 and N12. The pads 27a and 27b constitute the nodes of the transistor N11, and the pads 27c and 27d constitute the nodes of the transistor N12.

That is, the transistor P11 is constituted by the nanowire 21a, the gate interconnect 31, and the pads 22a and 22b, and the transistor P12 is constituted by the nanowire 21b, the gate interconnect 32, and the pads 22c and 22d. The transistor N11 is constituted by the nanowire 26a, the gate interconnect 31, and the pads 27a and 27b, and the transistor N12 is constituted by the nanowire 26b, the gate interconnect 32, and the pads 27c and 27d.

Local interconnects 41 and 42 extending in the Y direction are formed in the lower part of the capacitive element. The local interconnect 41 is connected with the pads 22a and 22c, and the local interconnect 42 is connected with the pads 22b and 22d. Local interconnects 43 and 44 extending in the Y direction are formed in the upper part of the capacitive element. The local interconnect 43 is connected with the pads 27a and 27c, and the local interconnect 44 is connected with the pads 27b and 27d.

Interconnects 61 and 62 extending in the X direction are formed in an M1 wiring layer that is a metal wiring layer. The interconnect 61 corresponds to the node IN1, and the interconnect 62 corresponds to the node IN2. The interconnect 61 is connected with the gate interconnect 31 through a contact 51, and the interconnect 62 is connected with the gate interconnect 32 through a contact 52.

As described above, according to the illustrated example, the capacitive element is formed using the transistors P11 and N11 that overlap each other as viewed in plan and of which the gates are mutually connected and the transistors P12 and N12 that overlap each other as viewed in plan and of which the gates are mutually connected. The nodes of the transistors P11 and P12 are mutually connected through the local interconnects 41 and 42, and the nodes of the transistors N11 and N12 are mutually connected through the local interconnects 43 and 44. Thus, a small-area, high breakdown-voltage capacitive element is implemented.

While both nodes of the transistor P11 are connected with both nodes of the transistor P12 in the above configuration, only one node may be connected with one node. Also, while both nodes of the transistor N11 are connected with both nodes of the transistor N12, only one node may be connected with one node.

Array Arrangement

FIGS. 4A and 4B are plan views showing another example of the layout structure of the capacitive element according to this embodiment, where FIG. 4A shows a lower part and FIG. 4B shows an upper part. The layout structure of FIGS. 4A and 4B corresponds to one in which (2×2) structures each same as the capacitive structure of FIGS. 1A and 1B are arranged in an array. In capacitive structures arranged in the X direction, adjacent transistors share one node. In capacitive structures arranged in the Y direction, adjacent transistors share a gate interconnect.

FIG. 5 is a circuit diagram showing a configuration of the capacitive element shown in FIGS. 4A and 4B. The capacitive element of FIG. 5 is connected to two nodes IN1. P-conductivity type transistors P11, P12, P13, and P14 and n-conductivity type transistors N11, N12, N13, and N14 are provided between one of the nodes IN1 and a node IN2. The gates of the transistors P11, P13, N11, and N13 are connected with the node IN1, and the gates of the transistors P12, P14, N12, and N14 are connected with the node IN2. Both nodes of the transistor P11 are connected with both nodes of the transistor P12, and both nodes of the transistor P13 are connected with both nodes of the transistor P14. The transistors P11 and P13 share one node, and the transistors P12 and P14 share one node. Both nodes of the transistor N11 are connected with both nodes of the transistor N12, and both nodes of the transistor N13 are connected with both nodes of the transistor N14. The transistors N11 and N13 share one node, and the transistors N12 and N14 share one node.

Also, p-conductivity type transistors P15, P16, P17, and P18 and n-conductivity type transistors N15, N16, N17, and N18 are provided between the other node IN1 and the node IN2. Since the connection relationships of the transistors P15 to P18 and N15 to N18 are similar to those of the transistors P11 to P14 and N11 to N14, details thereof are omitted here.

In FIGS. 4A and 4B, the transistors P11 and P13 are adjacent to each other in the X direction and share a pad 23a. Similarly, the transistors P12 and P14 share a pad 23b, the transistors P15 and P17 share a pad 23c, and the transistors P16 and P18 share a pad 23d. Also, the transistors N11 and N13 are adjacent to each other in the X direction and share a pad 28a. Similarly, the transistors N12 and N14 share a pad 28b, the transistors N15 and N17 share a pad 28c, and the transistors N16 and N18 share a pad 28d.

Gate interconnects 34a and 34b extend in the Y direction and in the Z direction. The gate interconnect 34a is shared by the transistors P12, P15, N12, and N15, and is to be the gates of the transistors P12, P15, N12, and N15. The gate interconnect 34b is shared by the transistors P14, P17, N14, and N17, and is to be the gates of the transistors P14, P17, N14, and N17.

Interconnects 63a, 63b, and 64 extending in the X direction are formed in an M1 wiring layer that is a metal wiring layer. The interconnects 63a and 63b correspond to the nodes IN1, and the interconnect 64 corresponds to the node IN2. The interconnects 63a and 63b are mutually connected through an upper-layer interconnect not shown. The interconnect 63a is connected with a gate interconnect 35a that is to be the gates of the transistors P11 and N11 and a gate interconnect 35b that is to be the gates of the transistors P13 and N13, through contacts 53a and 53b. The interconnect 63b is connected with a gate interconnect 35c that is to be the gates of the transistors P16 and N16 and a gate interconnect 35d that is to be the gates of the transistors P18 and N18, through contacts 53c and 53d. The interconnect 64 is connected with the gate interconnects 34a and 34b through contacts 54a and 54b.

The number of capacitive structures arranged in an array is not limited to (2×2). For example, three or more capacitive structures may be arranged in the X direction. In this case, in capacitive structures arranged in the X direction, it is just necessary for adjacent transistors to share one node. Also, three or more capacitive structures may be arranged in the Y direction. In this case, in capacitive structures arranged in the Y direction, it is just necessary for adjacent transistors to share a gate interconnect. The number of capacitive structures arranged in the X or Y direction may be one.

Serial Arrangement

FIGS. 6A and 6B are plan views showing yet another example of the layout structure of the capacitive element according to this embodiment, where FIG. 6A shows a lower part and FIG. 6B shows an upper part. The layout structure of FIGS. 6A and 6B corresponds to one in which two structures each same as the capacitive structure of FIGS. 1A and 1B are arranged in the Y direction. In the capacitive structures arranged in the Y direction, adjacent transistors share a gate interconnect.

Figure 7:
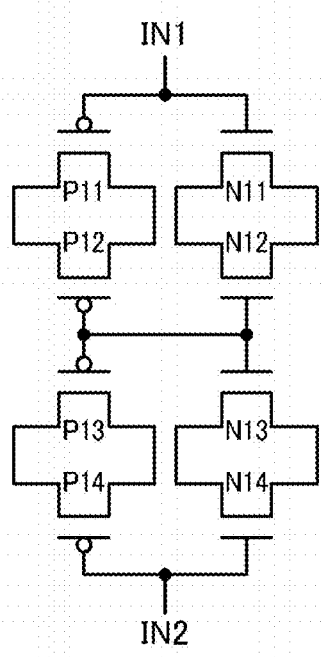
FIG. 7 is a circuit diagram of the capacitive element of FIGS. 6A and 6B.

FIG. 7 is a circuit diagram showing a configuration of the capacitive element shown in FIGS. 6A and 6B. The capacitive element of FIG. 7 corresponds to one in which two stages of capacitive elements each same as the capacitive element of FIG. 3 are arranged and connected in series between a node IN1 and a node IN2. The gates of transistors P11 and N11 are connected with the node IN1, the gates of transistors P12, P13, N12, and N13 are mutually connected, and the gates of transistors P14 and N14 are connected with the node IN2. Both nodes of the transistor P11 are connected with both nodes of the transistor P12, and both nodes of the transistor P13 are connected with both nodes of the transistor P14. Both nodes of the transistor N11 are connected with both nodes of the transistor N12, and both nodes of the transistor N13 are connected with both nodes of the transistor N14.

In the configuration of FIG. 7, four stages of transistors are connected between the nodes IN1 and IN2. That is, the voltage applied to the transistors P11 to P14 and N11 to N14 becomes ¼ of the voltage between the nodes IN1 and IN2. It is therefore possible to apply, to the capacitive element, a voltage higher than the breakdown voltage of the transistors P11 to P14 and N11 to N14.

In FIGS. 6A and 6B, a gate interconnect 36 extend in the Y direction and in the Z direction. The gate interconnect 36 is shared by the transistors P12, P13, N12, and N13 and is to be the gates of the transistors P12, P13, N12, and N13.

Interconnects 65 and 66 extending in the X direction are formed in an M1 wiring layer that is a metal wiring layer. The interconnect 65 corresponds to the node IN1, and the interconnect 66 corresponds to the node IN2. The interconnect 65 is connected with a gate interconnect 37a that is to be the gates of the transistors P11 and N11 through a contact 55. The interconnect 66 is connected with a gate interconnect 37b that is to be the gates of the transistors P14 and N14 through a contact 56.

The number of basic elements connected in series is not limited to two, but three or more of basic elements may be connected in series. Also, an odd number of stages, such as three stages of transistors may be connected in series. In this case, one of the nodes IN1 and IN2 is to be connected to nodes, not gates of transistors.

Serial Arrangement & Array Arrangement

FIGS. 8A and 8B are plan views showing yet another example of the layout structure of the capacitive element according to this embodiment, where FIG. 8A shows a lower part and FIG. 8B shows an upper part. The layout structure of FIGS. 8A and 8B corresponds to one in which, using the layout structure of FIGS. 6A and 6B as the basic structure, (2×2) such basic structures are arranged in an array. In basic structures arranged in the X direction, adjacent transistors share one node. In basic structures arranged in the Y direction, adjacent transistors share a gate interconnect.

FIG. 9 is a circuit diagram showing a configuration of the capacitive element shown in FIGS. 8A and 8B. The capacitive element of FIG. 9 is connected to two nodes IN1. P-conductivity type transistors P11 to P18 and n-conductivity type transistors N11 to N18 are provided between one of the nodes IN1 and a node IN2. The gates of the transistors P11, P15, N11, and N15 are connected with the node IN1, the gates of the transistors P12, P13, P16, P17, N12, N13, N16, and N17 are mutually connected, and the gates of the transistors P14, P18, N14, and N18 are connected with the node IN2. Both nodes of the transistor P11 are connected with both nodes of the transistor P12, both nodes of the transistor P13 are connected with both nodes of the transistor P14, both nodes of the transistor P15 are connected with both nodes of the transistor P16, and both nodes of the transistor P17 are connected with both nodes of the transistor P18. The transistors P11 and P15 share one node, and the transistors P12 and P16 share one node. The transistors P13 and P17 share one node, and the transistors P14 and P18 share one node. Both nodes of the transistor N11 are connected with both nodes of the transistor N12, both nodes of the transistor N13 are connected with both nodes of the transistor N14, both nodes of the transistor N15 are connected with both nodes of the transistor N16, and both nodes of the transistor N17 are connected with both nodes of the transistor N18. The transistors N11 and N15 share one node, and the transistors N12 and N16 share one node. The transistors N13 and N17 share one node, and the transistors N14 and N18 share one node.

Also, p-conductivity type transistors P21 to P28 and n-conductivity type transistors N21 to N28 are provided between the other node IN1 and the node IN2. Since the connection relationships of the transistors P21 to P28 and N21 to N28 are similar to those of the transistors P11 to P18 and N11 to N18, details thereof are omitted here.

In FIGS. 8A and 8B, the transistors P11 and P15 are adjacent to each other in the X direction and share a pad 24a. Similarly, the transistors P12 and P16 share a pad 24b, the transistors P13 and P17 share a pad 24c, and the transistors P14 and P18 share a pad 24d. The transistors P21 and P25 share a pad 24e, the transistors P22 and P26 share a pad 24f, the transistors P23 and P27 share a pad 24g, and the transistors P24 and P28 share a pad 24h. Also, the transistors N11 and N15 are adjacent to each other in the X direction and share a pad 29a. Similarly, the transistors N12 and N16 share a pad 29b, the transistors N13 and N17 share a pad 29c, and the transistors N14 and N18 share a pad 29d. The transistors N21 and N25 share a pad 29e, the transistors N22 and N26 share a pad 29f, the transistors N23 and N27 share a pad 29g, and the transistors N24 and N28 share a pad 29h.

Gate interconnects 38a, 38b, 38c, 38d, 38e, and 38f extend in the Y direction and in the Z direction. The gate interconnect 38a is shared by the transistors P12, P13, N12, and N13, and is to be the gates of the transistors P12, P13, N12, and N13. The gate interconnect 38b is shared by the transistors P16, P17, N16, and N17, and is to be the gates of the transistors P16, P17, N16, and N17. The gate interconnect 38c is shared by the transistors P14, P21, N14, and N21, and is to be the gates of the transistors P14, P21, N14, and N21. The gate interconnect 38d is shared by the transistors P18, P25, N18, and N25, and is to be the gates of the transistors P18, P25, N18, and N25. The gate interconnect 38e is shared by the transistors P22, P23, N22, and N23, and is to be the gates of the transistors P22, P23, N22, and N23. The gate interconnect 38f is shared by the transistors P26, P27, N26, and N27, and is to be the gates of the transistors P26, P27, N26, and N27.

Interconnects 67a, 67b, 68, 69a, and 69b extending in the X direction are formed in an M1 wiring layer that is a metal wiring layer. The interconnects 67a and 67b correspond to the nodes IN1, and the interconnect 68 corresponds to the node IN2. The interconnects 67a and 67b are mutually connected through an upper-layer interconnect not shown. The interconnect 67a is connected with a gate interconnect 39a that is to be the gates of the transistors P11 and N11 and a gate interconnect 39b that is to be the gates of the transistors P15 and N15, through contacts 57a and 57b. The interconnect 67b is connected with a gate interconnect 39c that is to be the gates of the transistors P24 and N24 and a gate interconnect 39d that is to be the gates of the transistors P28 and N28, through contacts 57c and 57d. The interconnect 68 is connected with the gate interconnects 38c and 38d through contacts 58a and 58b. The interconnect 69a is connected with the gate interconnects 38a and 38b through contacts 59a and 59b, and the interconnect 69b is connected with the gate interconnects 38e and 38f through contacts 59c and 59d.

The number of basic structures arranged in an array is not limited to (2×2). For example, three or more basic structures may be arranged in the X direction. In this case, in basic structures arranged in the X direction, it is just necessary for adjacent transistors to share one node. Also, three or more basic structures may be arranged in the Y direction. In this case, in basic structures arranged in the Y direction, it is just necessary for adjacent transistors to share a gate interconnect. The number of basic structures arranged in the X or Y direction may be one.

Alteration

FIGS. 10A and 10B are plan views showing an example of the layout structure of a capacitive element according to an alteration of the first embodiment, where FIG. 10A shows a lower part and FIG. 10B shows an upper part. FIG. 11 is a circuit diagram showing a configuration of the capacitive element shown in FIGS. 10A and 10B.

In this alteration, the local interconnects 41 and 43 overlapping each other as viewed in plan are connected through a contact 53, and the local interconnects 42 and 44 overlapping each other as viewed in plan are connected through a contact 54. That is, one node of the transistors P11 and P12 is connected with one node of the transistors N11 and N12, and the other node of the transistors P11 and P12 is connected with the other node of the transistors N11 and N12. This makes the operation of the capacitive element more stable and improves the resistance to noise.

As in the above-described configurations, the capacitive element of this alteration can be used as the basic structure to arrange such basic structures in an array or in series. Further, using a serially-arranged configuration as the basic structure, such basic structures can be arranged in an array.

Second Embodiment

Figure 13:
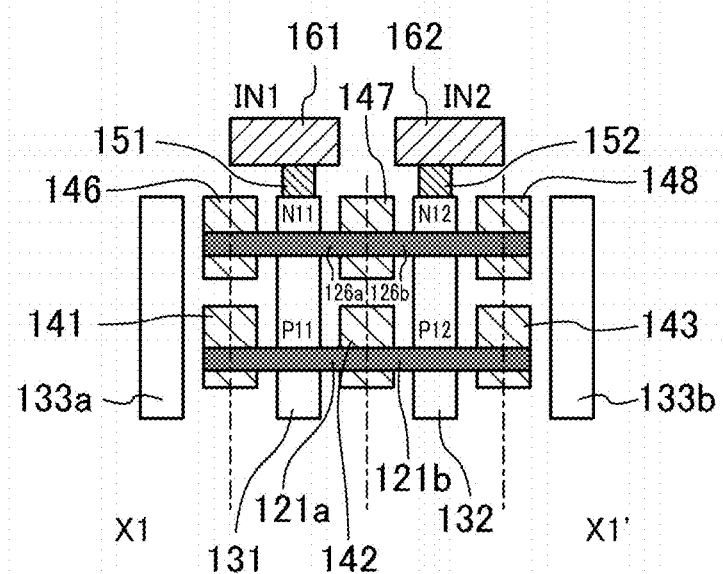
FIG. 13 is a cross-sectional view of the layout structure of FIGS. 12A and 12B taken in the horizontal direction as viewed in plan.

FIGS. 12A, 12B, and 13 are views showing an example of the layout structure of a capacitive element according to the second embodiment, where FIGS. 12A and 12B are plan views and FIG. 13 is a cross-sectional view taken in the horizontal direction as viewed in plan. Specifically, FIG. 12A shows a lower part and FIG. 12B shows an upper part. FIG. 13 shows a cross section taken along line X1-X1.

Figure 14:
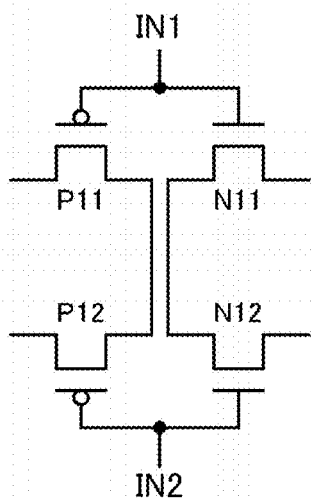
FIG. 14 is a circuit diagram of the capacitive element of FIGS. 12A and 12B.

FIG. 14 is a circuit diagram showing a configuration of the capacitive element shown in FIGS. 12A, 12B, and 13. A semiconductor integrated circuit device according to this embodiment includes the capacitive element shown in FIG. 14. The capacitive element of FIG. 14 includes p-conductivity type transistors P11 and P12 and n-conductivity type transistors N11 and N12 placed between a node IN1 and a node IN2. The gates of the transistors P11 and N11 are connected with the node IN1, and the gates of the transistors P12 and N12 are connected with the node IN2. One node of the transistor P11 is connected with one node of the transistor P12, and one node of the transistor N11 is connected with one node of the transistor N12. That is, the capacitive element of FIG. 14 has a capacitive structure including the transistors P11, P12, N11, and N12 provided between the nodes IN1 and IN2.

In the configuration of FIG. 14, the voltage applied to the transistors P11, P12, N11, and N12 becomes ½ of the voltage between the nodes IN1 and IN2. It is therefore possible to apply, to the capacitive element, a voltage higher than the breakdown voltage of the transistors P11, P12, N11, and N12.

In the first embodiment, the transistors P11 and P12 are arranged in the Y direction, and the nodes are connected through the local interconnects. The transistors N11 and N12 are also arranged in the Y direction, and the nodes are connected through the local interconnects. By contrast, in this embodiment, the transistors P11 and P12 are arranged in the X direction and share one node. The transistors N11 and N12 are also arranged in the X direction and share one node.

As shown in FIGS. 12A, 12B, and 13, nanowires 121a and 121b extending collinearly in the X direction are formed in the lower part of the capacitive element, and nanowires 126a and 126b extending collinearly in the X direction are formed in the upper part of the capacitive element. The nanowires 121a and 126a overlap each other as viewed in plan, and the nanowires 121b and 126b overlap each other as viewed in plan. Gate interconnects 131 and 132 extend in the Z direction in parallel with each other over the lower and upper parts. The gate interconnect 131 is to be the gates of the transistors P11 and N11, and the gate interconnect 132 is to be the gates of the transistors P12 and N12. Dummy gate interconnects 133a and 133b are formed on both ends of the capacitive element in the X direction. Like the gate interconnects 131 and 132, the dummy gate interconnects 133a and 133b extend in the Z direction.

A pad 122a doped with a p-type semiconductor is formed at the left end of the nanowire 121a as viewed in the figure. A pad 122b doped with a p-type semiconductor is formed between the nanowires 121a and 121b. A pad 122c doped with a p-type semiconductor is formed at the right end of the nanowire 121b as viewed in the figure. The nanowires 121a and 121b respectively constitute the channel portions of the transistors P11 and P12. The pads 122a and 122b constitute the nodes of the transistor P11, and the pads 122b and 122c constitute the nodes of the transistor P12. That is, the pad 122b is shared by the transistors P11 and P12, meaning that one node of the transistor P11 is connected with one node of the transistor P12.

A pad 127a doped with an n-type semiconductor is formed at the left end of the nanowire 126a as viewed in the figure. A pad 127b doped with an n-type semiconductor is formed between the nanowires 126a and 126b. A pad 127c doped with an n-type semiconductor is formed at the right end of the nanowire 126b as viewed in the figure. The nanowires 126a and 126b respectively constitute the channel portions of the transistors N11 and N12. The pads 127a and 127b constitute the nodes of the transistor N11, and the pads 127b and 127c constitute the nodes of the transistor N12. That is, the pad 127b is shared by the transistors N11 and N12, meaning that one node of the transistor N11 is connected with one node of the transistor N12.

That is, the transistor P11 is constituted by the nanowire 121a, the gate interconnect 131, and the pads 122a and 122b, and the transistor P12 is constituted by the nanowire 121b, the gate interconnect 132, and the pads 122b and 122c. The transistor N11 is constituted by the nanowire 126a, the gate interconnect 131, and the pads 127a and 127b, and the transistor N12 is constituted by the nanowire 126b, the gate interconnect 132, and the pads 127b and 127c.

Local interconnects 141, 142, and 143 extending in the Y direction are formed in the lower part of the capacitive element. The local interconnects 141, 142, and 143 are respectively connected with the pads 122a, 122b, and 122c. Local interconnects 146, 147, and 148 extending in the Y direction are formed in the upper part of the capacitive element. The local interconnects 146, 147, and 148 are respectively connected with the pads 127a, 127b, and 127c.

Interconnects 161 and 162 extending in the X direction in a line are formed in an M1 wiring layer that is a metal wiring layer. The interconnect 161 corresponds to the node IN1, and the interconnect 162 corresponds to the node IN2. The interconnect 161 is connected with the gate interconnect 131 through a contact 151, and the interconnect 162 is connected with the gate interconnect 132 through a contact 152.

As described above, according to the illustrated example, the capacitive element is formed using the transistors P11 and N11 that overlap each other as viewed in plan and of which the gates are mutually connected and the transistors P12 and N12 that overlap each other as viewed in plan and of which the gates are mutually connected. The transistors P11 and P12 are arranged in the X direction and share one node, and the transistors N11 and N12 are arranged in the X direction and share one node. This makes the area of the capacitive element further small compared to the first embodiment.

Array Arrangement

FIGS. 15A and 15B are plan views showing another example of the layout structure of the capacitive element according to this embodiment, where FIG. 15A shows a lower part and FIG. 15B shows an upper part. The layout structure of FIGS. 15A and 15B corresponds to one in which (2×2) structures each same as the capacitive structure of FIGS. 12A and 12B are arranged in an array. In capacitive structures arranged in the X direction, adjacent transistors share one node. In capacitive structures arranged in the Y direction, adjacent transistors share a gate interconnect, and both nodes of one of the adjacent transistors are connected with both nodes of the other transistor through local interconnects.

Figure 16:
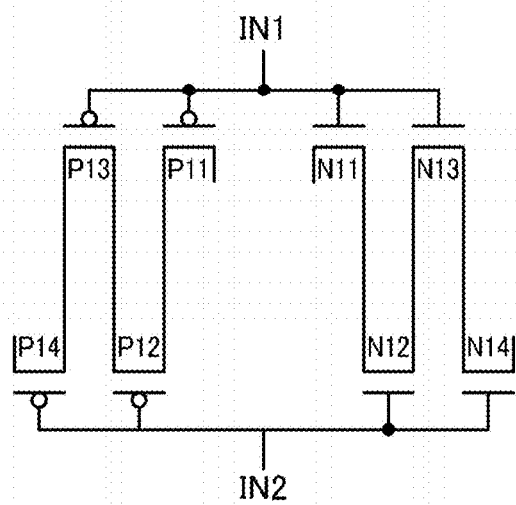
FIG. 16 is a circuit diagram of the capacitive element of FIGS. 15A and 15B.

FIG. 16 is a circuit diagram showing a configuration of the capacitive element shown in FIGS. 15A and 15B. In the circuit diagram of FIG. 16, it is to be noted that two transistors lying side by side in the Y direction are represented as one transistor. P-conductivity type transistors P11, P12, P13, and P14 and n-conductivity type transistors N11, N12, N13, and N14 are provided between a node IN1 and a node IN2. The gates of the transistors P11, P13, N11, and N13 are connected with the node IN1, and the gates of the transistors P12, P14, N12, and N14 are connected with the node IN2. One node of the transistor P11 is connected with one node of the transistor P12, one node of the transistor P12 is connected with one node of the transistor P13, and one node of the transistor P13 is connected with one node of the transistor P14. One node of the transistor N11 is connected with one node of the transistor N12, one node of the transistor N12 is connected with one node of the transistor N13, and one node of the transistor N13 is connected with one node of the transistor N14.

In FIGS. 15A and 15B, gate interconnects 134, 135, 136, and 137 extend in the Y direction and in the Z direction. The gate interconnect 134 is shared by the transistors P11 and N11, and is to be the gates of the transistors P11 and N11. Similarly, the gate interconnect 135 is to be the gates of the transistors P12 and N12, the gate interconnect 136 is to be the gates of the transistors P13 and N13, and the gate interconnect 137 is to be the gates of the transistors P14 and N14.

Interconnects 163 and 164 extending in the X direction are formed in an M1 wiring layer that is a metal wiring layer. The interconnect 163 corresponds to the node IN1, and the interconnect 164 corresponds to the node IN2. The interconnect 163 is connected with the gate interconnects 134 and 136 through contacts 153 and 154. The interconnect 164 is connected with the gate interconnects 135 and 137 through contacts 155 and 156.

The number of capacitive structures arranged in an array is not limited to (2×2). For example, three or more capacitive structures may be arranged in the X direction. In this case, in capacitive structures arranged in the X direction, it is just necessary for adjacent transistors to share one node. Also, three or more capacitive structures may be arranged in the Y direction. In this case, in capacitive structures arranged in the Y direction, it is just necessary that adjacent transistors share a gate interconnect and also both nodes of one of the adjacent transistors be connected with both nodes of the other transistor through local interconnects. The number of capacitive structures arranged in the X or Y direction may be one.

Third Embodiment

Figure 18A:
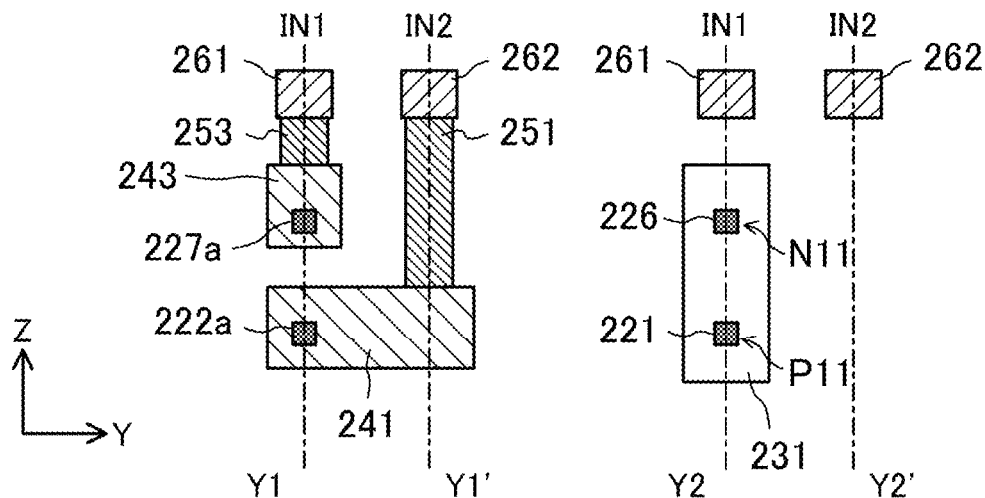
FIGS. 18A and 18B are cross-sectional views of the layout structure of FIGS. 17A and 17B taken in the vertical direction as viewed in plan.
Figure 18B:
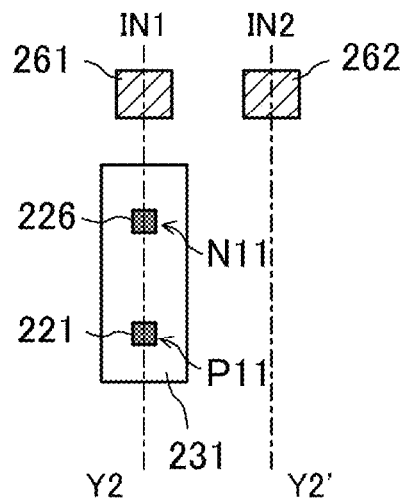

FIGS. 17A, 17B, 18A, and 18B are views showing an example of the layout structure of a capacitive element according to the third embodiment, where FIGS. 17A and 17B are plan views and FIGS. 18A and 18B are cross-sectional views taken in the vertical direction as viewed in plan. Specifically, FIG. 17A shows a lower part, and FIG. 17B shows an upper part. FIG. 18A shows a cross section taken along line Y1-Y1', and FIG. 18B shows a cross section taken along line Y2-Y2'.

Figure 19:
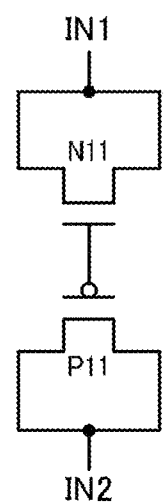
FIG. 19 is a circuit diagram of the capacitive element of FIGS. 17A and 17B.

FIG. 19 is a circuit diagram showing a configuration of the capacitive element shown in FIGS. 17A, 17B, 18A, and 18B. A semiconductor integrated circuit device according to this embodiment includes the capacitive element shown in FIG. 19. The capacitive element of FIG. 19 includes a p-conductivity type transistor P11 and an n-conductivity type transistor N11 placed between a node IN1 and a node IN2. The gates of the transistors P11 and N11 are mutually connected. Both nodes of the transistor N11 are connected with the node IN1, and both nodes of the transistor P11 are connected with the node IN2. Signals, for example, are given to the nodes IN1 and IN2, or the nodes IN1 and IN2 are connected with power supply lines. In the latter case, the capacitive element functions as an inter-power supply capacitance.

In the configuration of FIG. 19, the voltage applied to the transistors P11 and N11 becomes ½ of the voltage between the nodes IN1 and IN2. It is therefore possible to apply, to the capacitive element, a voltage higher than the breakdown voltage of the transistors P11 and N11.

As shown in FIGS. 17A, 17B, 18A, and 18B, a nanowire 221 extending in the X direction is formed in the lower part of the capacitive element, and a nanowire 226 extending in the X direction is formed in the upper part of the capacitive element. The nanowires 221 and 226 overlap each other as viewed in plan. A gate interconnect 231 extends in the Z direction over the lower and upper parts. The gate interconnect 231 is to be the gates of the transistors P11 and N11. Dummy gate interconnects 232a and 232b are formed on both ends of the capacitive element in the X direction. Like the gate interconnect 231, the dummy gate interconnects 232a and 232b extend in the Z direction.

Pads 222a and 222b doped with a p-type semiconductor are formed at both ends of the nanowire 221. The nanowire 221 constitutes the channel portion of the transistor P11, and the pads 222a and 222b constitute the nodes of the transistor P11. Pads 227a and 227b doped with an n-type semiconductor are formed at both ends of the nanowire 226. The nanowire 226 constitutes the channel portion of the transistor N11, and the pads 227a and 227b constitute the nodes of the transistor N11.

That is, the transistor P11 is constituted by the nanowire 221, the gate interconnect 231, and the pads 222a and 222b, and the transistor N11 is constituted by the nanowire 226, the gate interconnect 231, and the pads 227a and 227b.

Local interconnects 241 and 242 extending in the Y direction are formed in the lower part of the capacitive element. The local interconnect 241 is connected with the pad 222a, and the local interconnect 242 is connected with the pad 222b. Local interconnects 243 and 244 extending in the Y direction are formed in the upper part of the capacitive element. The local interconnect 243 is connected with the pad 227a, and the local interconnect 244 is connected with the pad 227b.

Interconnects 261 and 262 extending in the X direction are formed in an M1 wiring layer that is a metal wiring layer. The interconnect 261 corresponds to the node IN1, and the interconnect 262 corresponds to the node IN2. The interconnect 261 is connected with the local interconnect 243 through a contact 253 and also connected with the local interconnect 244 through a contact 254. The interconnect 262 is connected with the local interconnect 241 through a contact 251 and also connected with the local interconnect 242 through a contact 252. The local interconnects 243 and 244 are shorter than the local interconnects 241 and 242.

As described above, according to the illustrated example, the capacitive element is formed using the transistors P11 and N11 that overlap each other as viewed in plan and of which the gates are mutually connected. Also, since the single gate interconnect 231 extending in the Z direction is to be the gates of the transistors P11 and P12, wiring for mutually connecting the gates of the transistors P11 and N11 is unnecessary in the layout. It is therefore possible to reduce the area of the semiconductor integrated circuit device.

While both nodes of the transistor P11 are connected with the node IN2 in the above configuration, only one node may be connected with the node IN2. Also, while both nodes of the transistor N11 are connected with the node IN1, only one node may be connected with the node IN1.

Serial Arrangement

Figure 21A:
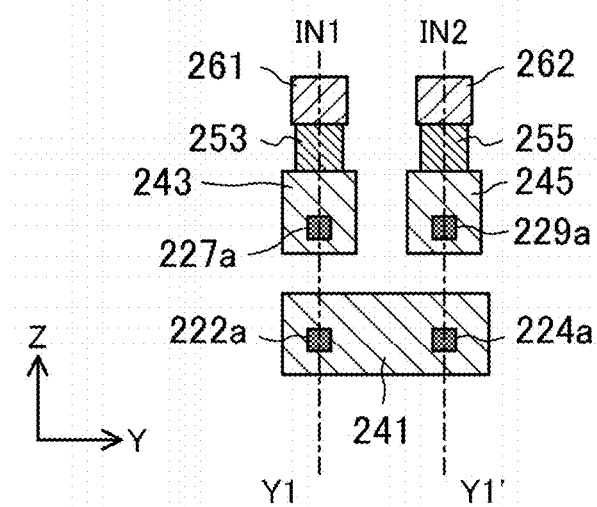
FIGS. 21A and 21B are cross-sectional views of the layout structure of FIGS. 20A and 20B taken in the vertical direction as viewed in plan.
Figure 21B:
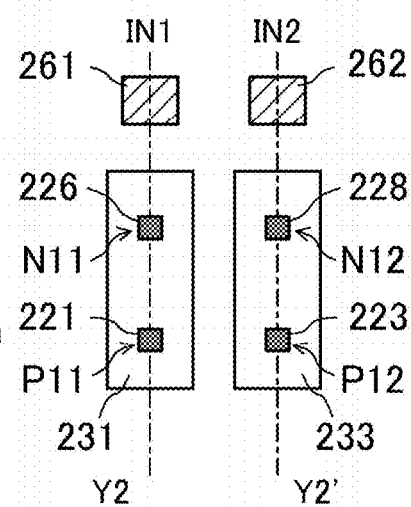

FIGS. 20A, 20B, 21A, and 21B are views showing another example of the layout structure of the capacitive element according to the third embodiment, where FIGS. 20A and 20B are plan views and FIGS. 21A and 21B are cross-sectional views taken in the vertical direction as viewed in plan. Specifically, FIG. 20A shows a lower part, and FIG. 20B shows an upper part. FIG. 21A shows a cross section taken along line Y1-Y1', and FIG. 21B shows a cross section taken along line Y2-Y2'. The layout structure of FIGS. 20A, 20B, 21A, and 21B corresponds to one in which two structures each same as the layout structure of FIGS. 17A, 17B, 18A, and 18B are arranged in the Y direction. In FIGS. 20A, 20B, 21A, and 21B, common components with those in FIGS. 17A, 17B, 18A, and 18B are denoted by the same reference characters and description thereof is omitted here.

Figure 22:
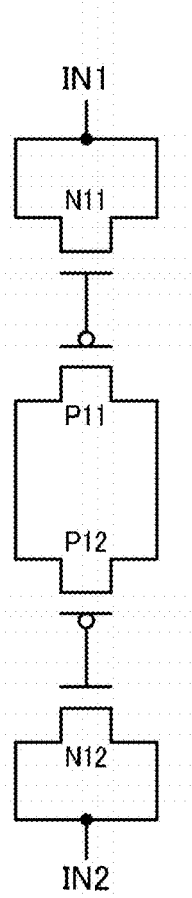
FIG. 22 is a circuit diagram of the capacitive element of FIGS. 20A and 20B.

FIG. 22 is a circuit diagram showing a configuration of the capacitive element shown in FIGS. 20A, 20B, 21A, and 21B. The capacitive element of FIG. 22 corresponds to one in which two stages of capacitive elements each same as the capacitive element of FIG. 19 are connected in series between the node IN1 and the node IN2. The gates of the transistors P11 and N11 are mutually connected, and the gates of transistors P12 and N12 are mutually connected. Both nodes of the transistor P11 are connected with both nodes of the transistor P12, both nodes of the transistor N11 are connected with the node IN1, and both nodes of the transistor N12 are connected with the node IN2. That is, the capacitive element of FIG. 22 has a capacitive structure having the transistors P11, P12, N11, and N12 provided between the nodes IN1 and IN2.

In the configuration of FIG. 22, four stages of transistors are connected between the nodes IN1 and IN2. That is, the voltage applied to the transistors P11, P12, N11, and N12 becomes ¼ of the voltage between the nodes IN1 and IN2. It is therefore possible to apply, to the capacitive element, a voltage higher than the breakdown voltage of the transistors P11, P12, N11, and N12.

As shown in FIGS. 20A, 20B, 21A, and 21B, a nanowire 223 extending in the X direction is formed in the lower part of the capacitive element, and a nanowire 228 extending in the X direction is formed in the upper part of the capacitive element. The nanowires 223 and 228 overlap each other as viewed in plan. A gate interconnect 233 extends in the Z direction over the lower and upper parts. The gate interconnect 233 is to be the gates of the transistors P12 and N12. Dummy gate interconnects 234a and 234b are formed on both ends of the capacitive element in the X direction. Like the gate interconnect 233, the dummy gate interconnects 234a and 234b extend in the Z direction.

Pads 224a and 224b doped with a p-type semiconductor are formed at both ends of the nanowire 223. The nanowire 223 constitutes the channel portion of the transistor P12, and the pads 224a and 224b constitute the nodes of the transistor P12. Pads 229a and 229b doped with an n-type semiconductor are formed at both ends of the nanowire 228. The nanowire 228 constitutes the channel portion of the transistor N12, and the pads 229a and 229b constitute the nodes of the transistor N12.

That is, the transistor P12 is constituted by the nanowire 223, the gate interconnect 233, and the pads 224a and 224b, and the transistor N12 is constituted by the nanowire 228, the gate interconnect 233, and the pads 229a and 229b.

In the lower part of the capacitive element, the local interconnect 241 is connected with the pads 222a and 224a, and the local interconnect 242 is connected with the pads 222b and 224b. The local interconnects 241 and 242 are not connected with any contact. In the upper part of the capacitive element, local interconnects 245 and 246 extend in the Y direction. The local interconnect 245 is connected with the pad 229a, and the local interconnect 246 is connected with the pad 229b.

The interconnect 262 is connected with the local interconnect 245 through a contact 255 and also connected with the local interconnect 246 through a contact 256. The interconnect 262 is not connected with the local interconnect 241 nor 242.

As described above, according to the illustrated example, the capacitive element is formed using the transistors P11 and N11 that overlap each other as viewed in plan and of which the gates are mutually connected and the transistors P12 and N12 that overlap each other as viewed in plan and of which the gates are mutually connected. Also, since the single gate interconnect 231 extending in the Z direction is to be the gates of the transistors P11 and N11, and the single gate interconnect 233 extending in the Z direction is to be the gates of the transistors P12 and N12, wiring for mutually connecting the gates of the transistors P11 and N11 and also wiring for mutually connecting the gates of the transistors P12 and N12 are unnecessary in the layout. Further, mutual connection between the nodes of the transistors P11 and P12 is implemented through the local interconnects 241 and 242. It is therefore possible to reduce the area of the semiconductor integrated circuit device.

While both nodes of the transistor N11 are connected with the node IN1 in the above configuration, only one node may be connected with the node IN1. Also, while both nodes of the transistor N12 are connected with the node IN2, only one node may be connected with the node IN2. While both nodes of the transistor P11 are connected with both nodes of the transistor P12, only one node of the transistor P11 may be connected with one node of the transistor P12.

The p-type transistors and the n-type transistors may be interchanged in the positions between the nodes IN1 and IN2, to connect the nodes of the p-type transistors with the nodes IN1 and IN2. In this case, it is preferable to place the p-type transistors in the upper part of the capacitive element so that the connection of the transistors with the interconnects corresponding to the nodes IN1 and IN2 can be easily configured.

Serial Arrangement & Array Arrangement

FIGS. 23A and 23B are plan views showing yet another example of the layout structure of the capacitive element according to this embodiment, where FIG. 23A shows a lower part and FIG. 23B shows an upper part. The layout structure of FIGS. 23A and 23B corresponds to one in which (2×2) structures each same as the capacitive structure of FIGS. 20A and 20B are arranged in an array. In capacitive structures arranged in the X direction, adjacent transistors share one node. In capacitive structures arranged in the Y direction, adjacent transistors share both nodes in the upper part of the capacitive element.

Figure 24:
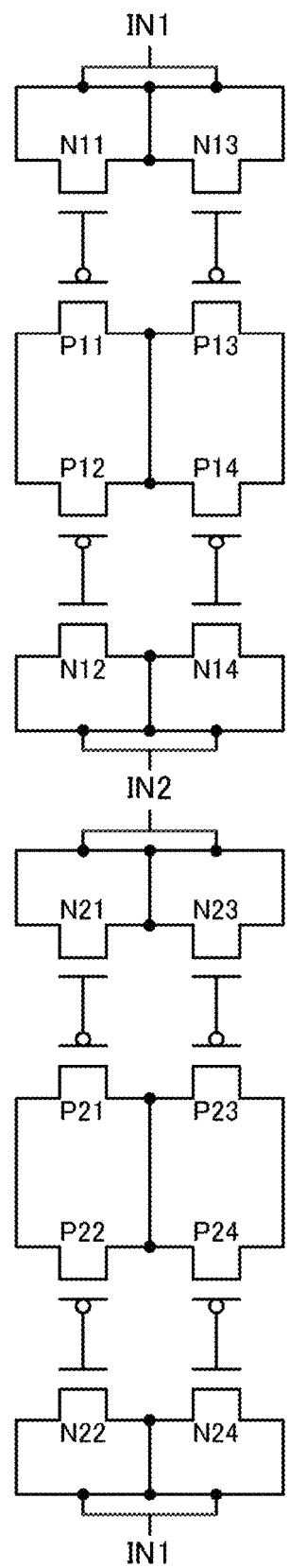
FIG. 24 is a circuit diagram of the capacitive element of FIGS. 23A and 23B.

FIG. 24 is a circuit diagram showing a configuration of the capacitive element shown in FIGS. 23A and 23B. The capacitive element of FIG. 24 is connected to two nodes IN1. P-conductivity type transistors P11 to P14 and n-conductivity type transistors N11 to N14 are provided between one of the nodes IN1 and a node IN2. Both nodes of each of the transistors N11 and N13 are connected with the nodes IN1, and both nodes of each of the transistors N12 and N14 are connected with the nodes IN2. The gates of the transistors N11 and P11 are mutually connected, and the gates of the transistors N13 and P13 are mutually connected. Both nodes of the transistor P11 are connected with both nodes of the transistor P12, and both nodes of the transistor P13 are connected with both nodes of the transistor P14. The transistors P11 and P13 share one node, and the transistors P12 and P14 share one node. The gates of the transistors P12 and N12 are mutually connected, and the gates of the transistors P14 and N14 are mutually connected.

Also, p-conductivity type transistors P21 to P24 and n-conductivity type transistors N21 to N24 are provided between the other node IN1 and the node IN2. Since the connection relationships of the transistors P21 to P24 and N21 to N24 are similar to those of the transistors P11 to P14 and N11 to N14, detailed description thereof is omitted here.

In FIGS. 23A and 23B, the transistors P11 and P13 share a pad 225a. Similarly, the transistors P12 and P14 share a pad 225b, the transistors P21 and P23 share a pad 225c, and the transistors P22 and P24 share a pad 225d. Similarly, the transistors N11 and N13 share a pad 225e, the transistors N12 and N14 share a pad 225f, the transistors N21 and N23 share a pad 225g, and the transistors N22 and N24 share a pad 225h.

Interconnects 263a, 263b, and 264 extending in the X direction are formed in an M1 wiring layer that is a metal wiring layer. The interconnects 263a and 263b correspond to the nodes IN1, and the interconnect 264 corresponds to the node IN2. The interconnects 263a and 263b are mutually connected through an upper-layer interconnect not shown. The interconnect 263a is connected with local interconnects 247a, 247b, and 247c, which are connected to the nodes of the transistors N11 and N13, through contacts 257a, 257b, and 257c. The interconnect 263b is connected with local interconnects 248a, 248b, and 248c, which are connected to the nodes of the transistors N22 and N24, through contacts 257d, 257e, and 257f. The interconnect 264 is connected with local interconnects 249a, 249b, and 249c, which are connected to the nodes of the transistors N12, N14, N21, and N23, through contacts 258a, 258b, and 258c.

The number of capacitive structures arranged in an array is not limited to (2×2). For example, three or more capacitive structures may be arranged in the X direction. In this case, in capacitive structures arranged in the X direction, it is just necessary for adjacent transistors to share one node. Also, three or more capacitive structures may be arranged in the Y direction. In this case, in capacitive structures arranged in the Y direction, it is just necessary for adjacent transistors in the upper part to share their nodes. The number of capacitive structures arranged in the X or Y direction may be one.

Other Embodiments

In the above-described embodiments, p-type transistors are formed in the lower part and n-type transistors are formed in the upper part. Contrary to this, it is acceptable to form n-type transistors in the lower part and p-type transistors in the upper part.

Also, transistors of the same conductivity type may be formed in the lower and upper parts. That is, the capacitive element according to the present disclosure may be constituted by only p-type transistors or only n-type transistors. It is however noted that the circuit function of the semiconductor integrated circuit device is implemented by normal CFETs, i.e., p-type transistors and n-type transistors formed one above the other in the depth direction.

In the above case, the semiconductor integrated circuit device may be fabricated as follows. Assume that n-type transistors are formed in the upper part and, in the lower part, while p-type transistors are formed in the normal circuit portion, n-type transistors are formed for only capacitive elements. In this case, at the time of formation of transistors in the lower part, while the portion of the capacitive elements is masked, the other portion is subjected to p-conductivity type doping. Thereafter, the portion of the capacitive elements is subjected to n-conductivity type doping while the other portion is masked.

In the above embodiments, while each transistor is assumed to have one nanowire, some or all transistors may have a plurality of nanowires. In this case, a plurality of nanowires may be arranged in the Y direction as viewed in plan, or arranged in the Z direction. Otherwise, a plurality of nanowires may be arranged in both the Y direction and the Z direction. The number of nanowires included in each transistor may be different between the upper and lower parts of the capacitive element.

Also, in the above embodiments, while the cross-sectional shape of the nanowires is roughly square, it is not limited to this. For example, the shape may be circular or rectangular.

While the above embodiments have been described taking nanowire FETs as an example of three-dimensional transistors, the transistor type is not limited to this. For example, fin transistors may be used as the transistors formed in the lower part of the capacitive element.

According to the present disclosure, a capacitive element with a high breakdown voltage and a small area can be implemented using a CFET. The present disclosure is therefore useful for improvement of the performance of a semiconductor chip, for example.

What is claimed is:

1. A semiconductor integrated circuit device provided with a capacitive element, the capacitive element including at least one capacitive structure provided between a first node and a second node, the capacitive structure comprising:
   a first transistor that is a three-dimensional transistor of a first conductivity type;
   a second transistor that is a three-dimensional transistor of a second conductivity type, formed above the first transistor in a depth direction, overlapping the first transistor as viewed in plan, a gate thereof being connected with a gate of the first transistor;
   a third transistor that is a three-dimensional transistor of the first conductivity type formed at a same level as the first transistor;
   a fourth transistor that is a three-dimensional transistor of the second conductivity type, formed at a same level as the second transistor, overlapping the third transistor as viewed in plan, a gate thereof being connected with a gate of the third transistor;
   a first local interconnect extending in a second direction perpendicular to a first direction in which channel portions of the first to fourth transistors extend, and connecting one node of the first transistor and one node of the third transistor;
   a second local interconnect extending in the second direction and connecting one node of the second transistor and one node of the fourth transistor;
   a third local interconnect extending in the second direction and connecting the other node of the first transistor and the other node of the third transistor; and
   a fourth local interconnect extending in the second direction and connecting the other node of the second transistor and the other node of the fourth transistor.

2. The semiconductor integrated circuit device of claim 1, wherein
in the capacitive structure, the gates of the first and second transistors are connected with one of the first and second nodes, and
the gates of the third and fourth transistors are connected with the other of the first and second nodes.

3. The semiconductor integrated circuit device of claim 1, wherein
the capacitive element includes a plurality of the capacitive structures,
the plurality of capacitive structures include first and second capacitive structures arranged in the first direction, and
the first, second, third, and fourth transistors of the first capacitive structure respectively share one node with the first, second, third, and fourth transistors of the second capacitive structure.

4. The semiconductor integrated circuit device of claim 3, wherein
the capacitive element includes a plurality of the capacitive structures,
the plurality of capacitive structures include first and second capacitive structures arranged in the second direction, and
the gates of the third and fourth transistors of the first capacitive structure and the gates of the first and second transistors of the second capacitive structure are connected in common with one of the first and second nodes.

5. The semiconductor integrated circuit device of claim 1, wherein
the first and second local interconnects overlap each other as viewed in plan and are mutually connected through a contact.

6. The semiconductor integrated circuit device of claim 1, wherein
the first conductivity type and the second conductivity type are different conductivity types.

7. The semiconductor integrated circuit device of claim 1, wherein
the first conductivity type and the second conductivity type are the same conductivity type.

8. The semiconductor integrated circuit device of claim 1, wherein
the capacitive structure further comprises:
a single first gate interconnect extending in the depth direction, which is to be the gates of the first and second transistors; and
a single second gate interconnect extending in the depth direction, which is to be the gates of the third and fourth transistors.

9. The semiconductor integrated circuit device of claim 1, wherein
the capacitive element includes a plurality of the capacitive structures,
the plurality of capacitive structures are connected in series between the first and second nodes, and
in two mutually-connected capacitive structures, the gates of the third and fourth transistors of one capacitive structure are connected with the gates of the first and second transistors of the other capacitive structure.

10. A semiconductor integrated circuit device provided with a capacitive element, the capacitive element including at least one capacitive structure provided between a first node and a second node, the capacitive structure comprising:
a first transistor that is a three-dimensional transistor of a first conductivity type;
a second transistor that is a three-dimensional transistor of a second conductivity type, formed above the first transistor in a depth direction, overlapping the first transistor as viewed in plan, a gate thereof being connected with a gate of the first transistor;
a third transistor that is a three-dimensional transistor of the first conductivity type formed at a same level as the first transistor;
a fourth transistor that is a three-dimensional transistor of the second conductivity type, formed at a same level as the second transistor, overlapping the third transistor as viewed in plan, a gate thereof being connected with a gate of the third transistor;
a first local interconnect extending in a second direction perpendicular to a first direction in which channel portions of the first to fourth transistors extend, and connecting one node of the first transistor and one node of the third transistor; and
a second local interconnect extending in the second direction and connecting one node of the second transistor and one node of the fourth transistor; wherein
the capacitive element includes a plurality of the capacitive structures,
the plurality of capacitive structures are connected in series between the first and second nodes, and
in two mutually-connected capacitive structures, the gates of the third and fourth transistors of one capacitive structure are connected with the gates of the first and second transistors of the other capacitive structure.

11. The semiconductor integrated circuit device of claim 10, wherein
the capacitive structure further comprises:
a single first gate interconnect extending in the depth direction, which is to be the gates of the first and second transistors; and
a single second gate interconnect extending in the depth direction, which is to be the gates of the third and fourth transistors.

12. The semiconductor integrated circuit device of claim 10, wherein
in the capacitive structure, the gates of the first and second transistors are connected with one of the first and second nodes, and
the gates of the third and fourth transistors are connected with the other of the first and second nodes.

13. The semiconductor integrated circuit device of claim 10, wherein
the first and second local interconnects overlap each other as viewed in plan and are mutually connected through a contact.

14. The semiconductor integrated circuit device of claim 10, wherein
the first conductivity type and the second conductivity type are different conductivity types.

15. The semiconductor integrated circuit device of claim 10, wherein
the first conductivity type and the second conductivity type are the same conductivity type.

16. A semiconductor integrated circuit device provided with a capacitive element, the capacitive element including at least one capacitive structure provided between a first node and a second node, the capacitive structure comprising:
a first transistor that is a three-dimensional transistor of a first conductivity type;

a second transistor that is a three-dimensional transistor of a second conductivity type, formed above the first transistor in a depth direction, overlapping the first transistor as viewed in plan, a gate thereof being connected with a gate of the first transistor;

a third transistor that is a three-dimensional transistor of the first conductivity type formed at a same level as the first transistor; and a fourth transistor that is a three-dimensional transistor of the second conductivity type, formed at a same level as the second transistor, overlapping the third transistor as viewed in plan, a gate thereof being connected with a gate of the third transistor, wherein the first and third transistors are arranged in a first direction in which channel portions of the first to fourth transistors extend, and share one node, the second and fourth transistors are arranged in the first direction and share one node, the capacitive element includes a plurality of the capacitive structures, the plurality of capacitive structures include first and second capacitive structures arranged in a second direction perpendicular to the first direction, and the gates of the first and second transistors of the first capacitive structure and the gates of the first and second transistors of the second capacitive structure are connected in common with one of the first and second nodes, and the gates of the third and fourth transistors of the first capacitive structure and the gates of the third and fourth transistors of the second capacitive structure are connected in common with the other of the first and second nodes.

17. The semiconductor integrated circuit device of claim 16, wherein the capacitive structure further comprises:

a single first gate interconnect extending in the depth direction, which is to be the gates of the first and second transistors; and a single second gate interconnect extending in the depth direction, which is to be the gates of the third and fourth transistors.

18. The semiconductor integrated circuit device of claim 16, wherein in the capacitive structure, the gates of the first and second transistors are connected with one of the first and second nodes, and the gates of the third and fourth transistors are connected with the other of the first and second nodes.

* * * * *